(12) United States Patent
Sovani

(10) Patent No.: US 11,847,388 B2
(45) Date of Patent: Dec. 19, 2023

(54) SYSTEMS AND METHODS FOR REDUCING RIGID BODY MOTION IN SIMULATED MODELS

(71) Applicant: Materialise N.V., Leuven (BE)

(72) Inventor: Yogesh Sovani, Leuven (BE)

(73) Assignee: MATERIALISE N.V., Leuven (BE)

( * ) Notice: Subject to any disclaimer, the term of this patent is extended or adjusted under 35 U.S.C. 154(b) by 423 days.

(21) Appl. No.: 17/257,124

(22) PCT Filed: Jul. 3, 2019

(86) PCT No.: PCT/US2019/040628
§ 371 (c)(1),
(2) Date: Dec. 30, 2020

(87) PCT Pub. No.: WO2020/014078
PCT Pub. Date: Jan. 16, 2020

(65) Prior Publication Data
US 2021/0124859 A1 Apr. 29, 2021

Related U.S. Application Data

(60) Provisional application No. 62/696,237, filed on Jul. 10, 2018.

(51) Int. Cl.
| | | |
|---|---|---|
| G06F 30/23 | (2020.01) | |
| B29C 64/386 | (2017.01) | |
| G06F 30/18 | (2020.01) | |
| B33Y 10/00 | (2015.01) | |
| B33Y 30/00 | (2015.01) | |
| B33Y 50/00 | (2015.01) | |
| B29C 64/40 | (2017.01) | |

(52) U.S. Cl.
CPC ............ *G06F 30/23* (2020.01); *B29C 64/386* (2017.08); *G06F 30/18* (2020.01); *B29C 64/40* (2017.08); *B33Y 10/00* (2014.12); *B33Y 30/00* (2014.12); *B33Y 50/00* (2014.12)

(58) Field of Classification Search
CPC .......... G06F 30/23; G06F 30/18; G06F 30/25; G06F 30/367; G06F 30/398; G06F 2111/00; G06F 2119/22; B29C 64/386; B29C 64/40; B33Y 10/00; B33Y 30/00; B33Y 50/00
See application file for complete search history.

(56) References Cited

U.S. PATENT DOCUMENTS

| | | | | |
|---|---|---|---|---|
| 5,819,070 A | * | 10/1998 | Sasaki ................ | G06T 17/20 715/205 |
| 5,946,479 A | * | 8/1999 | Sakaguchi .......... | G06F 17/10 716/51 |
| 6,407,738 B1 | * | 6/2002 | Wakabayashi ...... | G06T 17/20 345/424 |

FOREIGN PATENT DOCUMENTS

| | | | | |
|---|---|---|---|---|
| EP | 3246831 A1 | * | 11/2017 | .............. B22F 10/20 |
| EP | 3246831 A1 | | 11/2017 | |

OTHER PUBLICATIONS

Kuo, Yu-Hsin et al., Support structure design in additive manufacturing based on topology optimization, Structural and Multidisciplinary Optimization, Springer Berlin Heidelberg, Jul. 1, 2017, 57:1, pp. 183-195.

* cited by examiner

*Primary Examiner* — Kibrom K Gebresilassie
(74) *Attorney, Agent, or Firm* — Dinsmore & Shohl LLP

(57) ABSTRACT

A system and method for automatically reducing rigid body motion in a digital simulated model of an object, where the simulated model represents a simulated build of the object using additive manufacturing.

20 Claims, 18 Drawing Sheets

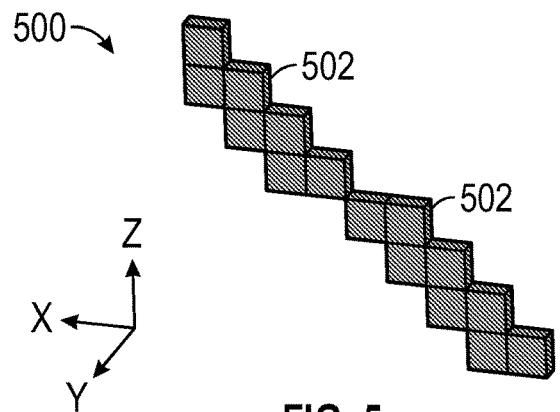
FIG. 5
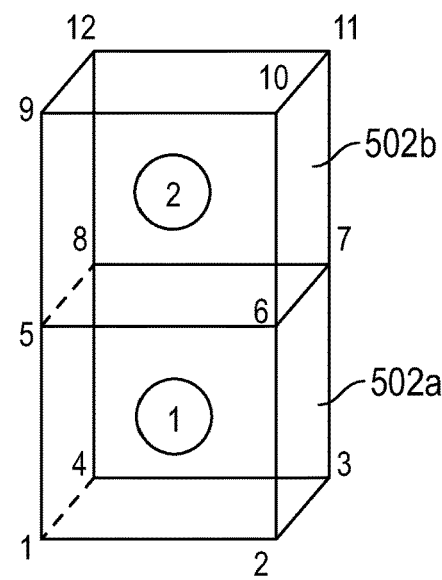
FIG. 5A
| NODEID | ELEMENTIDS |
|--------|------------|
| 1 | 1 |
| 2 | 1 |
| 3 | 1 |
| 4 | 1 |
| 5 | 1,2 |
| 6 | 1,2 |
| 7 | 1,2 |
| 8 | 1,2 |
| 9 | 2 |
| 10 | 2 |
| 11 | 2 |
| 12 | 2 |
FIG. 5B

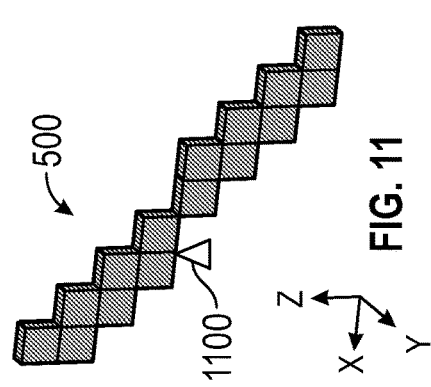
FIG. 8
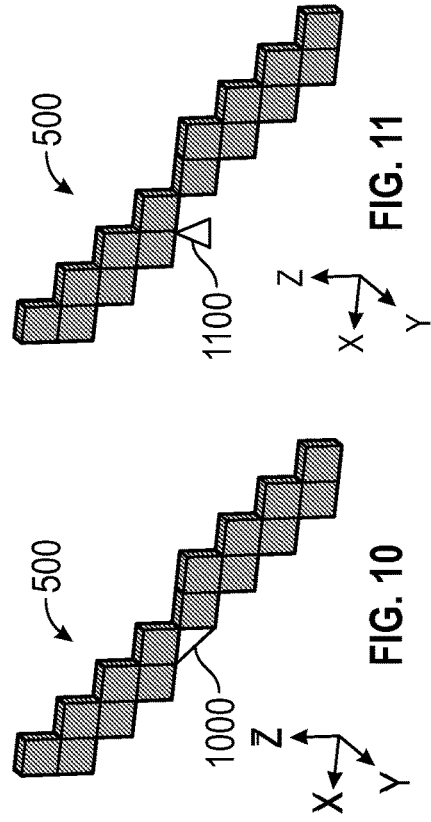
FIG. 9
FIG. 10
FIG. 11
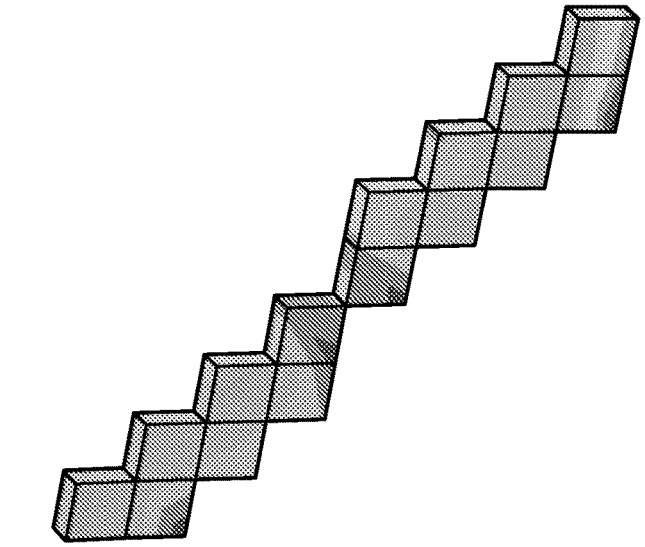
FIG. 12A
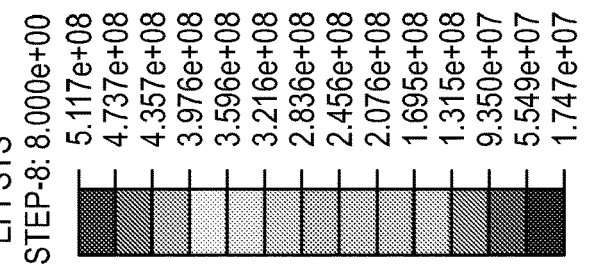
FIG. 12B

1355

| NODE-TO-ELEMENT MAP ||
|---|---|
| #NODE | #ELEMENTS |
| 1 | 1 |
| 2 | 1 |
| 3 | 1,2 |
| 4 | 1,2 |
| 5 | 2 |
| 6 | 2 |
| 7 | 1 |
| 8 | 1 |
| 9 | 1,2,3 |
| 10 | 1,2,3 |
| 11 | 2,3,4 |
| 12 | 2,3,4 |
| 13 | 4,5 |
| 14 | 4,5 |
| 15 | 5 |
| 16 | 5 |
| 17 | 3 |
| 18 | 3 |
| 19 | 3,4 |
| 20 | 3,4 |
| 21 | 4,5 |
| 22 | 4,5 |
| 23 | 5,6 |
| 24 | 5,6 |
| 25 | 6 |
| 26 | 6 |
| 27 | 6 |
| 28 | 6 |
| 29 | 6 |
| 30 | 6 |

1360

| #ELEMENT | BOTTOM NODES | | | | NODE-TO-ELEMENT MAP CORRESPONDING TO BOTTOM NODES | | | | # BOTTOM NODES SHARED BY SINGLE ELEMENT | DOES ELEMENT HAVE>=2 BOTTOM NODES SHARED BY SINGLE ELEMENT | FLOATING NODES |
|---|---|---|---|---|---|---|---|---|---|---|---|
| 1 | 1 | 2 | 4 | 3 | 1 | 1 | 1,2 | 1,2 | 2 | TRUE | 1,2 |
| 2 | 3 | 4 | 6 | 5 | 1,2 | 1,2 | 2 | 2 | 2 | TRUE | 5,6 |
| 3 | 9 | 10 | 12 | 11 | 1,2,3 | 1,2,3 | 2,3,4 | 2,3,4 | 0 | FALSE | NA |
| 4 | 11 | 12 | 14 | 13 | 2,3,4 | 2,3,4 | 4,5 | 4,5 | 0 | FALSE | NA |
| 5 | 13 | 14 | 16 | 15 | 4,5 | 4,5 | 5 | 5 | 2 | TRUE | 15,16 |
| 6 | 23 | 24 | 26 | 25 | 5,6 | 5,6 | 6 | 6 | 2 | TRUE | 25,26 |

SYSTEMS AND METHODS FOR REDUCING RIGID BODY MOTION IN SIMULATED MODELS

CROSS-REFERENCE TO RELATED APPLICATIONS

This application claims the benefit of U.S. Provisional Patent Application No. 62/696,237, filed Jul. 10, 2018. The content of the provisional application is hereby incorporated by reference in its entirety.

BACKGROUND OF THE INVENTION

Field of the Invention

This application relates to additive manufacturing. More particularly, this application relates to systems and methods for simulating build of an object using additive manufacturing.

Description of the Related Technology

In the field of additive manufacturing, three dimensional solid objects are formed from a digital model. Because the manufactured objects are three dimensional, additive manufacturing is commonly referred to as three dimensional ("3D") printing. Some techniques for additive manufacturing include selective laser sintering ("LS") manufacturing and metal sintering. These techniques direct a laser beam to a specified location in order to polymerize or solidify layers of building materials which are used to create the desired three dimensional ("3D") object. The 3D object is built on a layer-by-layer basis by solidifying the layers of the building material.

It can be difficult at the design stage to know whether a particular designed object can be successfully built (e.g., without errors, within tolerances, etc.). Accordingly, build of an object may fail during the additive manufacturing process. If build of an object fails during the additive manufacturing process, the partially built object may need to be discarded, the object redesigned, and then the actual additive manufacturing of the object started over again. There is potential that the build may fail several times during actual additive manufacturing of the object costing time and materials.

For example, additive manufacturing techniques using an energy source to process raw building materials tend to create thermal and mechanical stresses and strains during the manufacturing process. These stresses and strains may, for example, be caused by the heating and cooling of the raw building materials, which leads to expansion and shrinkage of the material during manufacturing. For example, high stresses and strains may occur when manufacturing parts out of metal and metal powders using a laser or other energy source. The stresses and strains on the object, during or after manufacturing can deform the object, or during manufacturing can even prevent the build process from continuing, thereby leading to a build failure.

In order to avoid the waste of time and/or materials from attempting to build an object and having the additive manufacturing process fail, or the resulting object not conform to the designed object, computing devices can be used to simulate the build of an object using additive manufacturing. Such simulated build of an object may result in a digital simulated model of the object. If the simulated model of the object does not conform to the original design of the object or if other errors are detected, then the design of the object and/or parameters for building the object can be changed, and the simulation of the build can again be performed to generate a new simulated model of the object. Such simulated build of the object may be iteratively performed until the resulting simulated model of the object successfully conforms to the designed object and/or there are no errors detected. Then the actual object may be built using additive manufacturing. By simulating the build of the object for each iteration instead of trying to actually build the object for each iteration, the time and materials wasted for unsuccessful builds is reduced.

However, in some cases a simulated build of an object may fail and abort before a simulated model of the entire object is generated. Accordingly, the simulated model may only include part of the object. A designer, accordingly, may only have access to the part of the object in the simulated model due to the simulation abortion, which may provide the designer with only limited information as to why the build failed. Such limited information may make it more difficult for the designer to properly re-design the object or adjust parameters of the build.

In view of these and other problems identified by the inventor, systems and methods that improve simulating build of an object to be built using additive manufacturing are described herein.

SUMMARY

One embodiment provides, a computer-implemented method for modifying a finite element model of a 3D object to reduce rigid body motion experienced by the finite element model during build simulation for additive manufacturing. The method includes obtaining the finite element model, the finite element model comprising a plurality of nodes and a plurality of elements, wherein one or more nodes of the plurality of nodes are associated with more than one element of the plurality of elements. The method includes identifying a plurality of bottom nodes of the plurality of elements. The method includes determining a number of elements associated with each of the plurality of bottom nodes. The method includes identifying one or more bottom nodes of the plurality of bottom nodes that are associated with only one element as one or more floating nodes. The method includes modifying the finite element model to include one or more stability elements at the one or more floating nodes. The method includes simulating build of the object using the modified finite element model to generate a simulated model of the object.

Another embodiment provides, a computer-implemented method for modifying a finite element model of a 3D object to reduce rigid body motion experienced by the finite element model during build simulation for additive manufacturing. The method includes obtaining the finite element model, the finite element model comprising a plurality of nodes and a plurality of elements, wherein one or more nodes of the plurality of nodes are associated with more than one element of the plurality of elements, each of the plurality of elements comprising a centroid corresponding to the center of the element. The method further includes calculating centroid pair distances between centroids of pairs of neighboring elements of the plurality of elements, wherein pairs of elements are neighboring elements to one another if they share at least one node. The method further includes determining any element of the plurality of elements that does not have a coupling to a corresponding neighboring element via a path of one or more centroid pair distances that are less than or equal to a threshold length to be an instable element. The method further includes modifying the finite element model to include one or more additional elements as coupled to any instable elements. The method further includes simulating build of the object using the modified finite element model to generate a simulated model of the object.

Another embodiment provides, a computer-implemented method for using a finite element model of an object during build simulation for additive manufacturing. The method includes obtaining the finite element model, the finite element model comprising a plurality of elements including a first element having a bottom surface that is not parallel to a simulated build platform of a simulated additive manufacturing device. The method further includes simulating build of the object using the modified finite element model to generate a simulated model of the object.

Certain embodiments provide a non-transitory computer-readable medium having computer-executable instructions stored thereon, which, when executed by a processor of a computing device, cause the computing device to perform one or more of the described methods.

Certain embodiments provide a computing device comprising a memory and a processor configured to perform one or more of the described methods.

BRIEF DESCRIPTION OF THE DRAWINGS

FIG. 5 illustrates an example of a finite element model of an object.

FIG. 5A illustrates two example elements for a finite element model.

FIG. 5B illustrates an example node to element map for the elements of FIG. 5A.

FIG. 8 illustrates an example spring placed at nodes of the finite element model of FIG. 5.

FIG. 9 illustrates example additional elements placed in the finite element model of FIG. 5.

FIG. 10 illustrates an example one dimensional element placed in the finite element of FIG. 5.

FIG. 11 illustrates an example constraint placed at a node of the finite element model of FIG. 5.

FIGS. 12A and 12B illustrate an example resulting simulated model of an example simulation of the build of the object represented by a modified finite element model of one of FIGS. 8-11.

DETAILED DESCRIPTION OF CERTAIN INVENTIVE EMBODIMENTS

Figure 1:
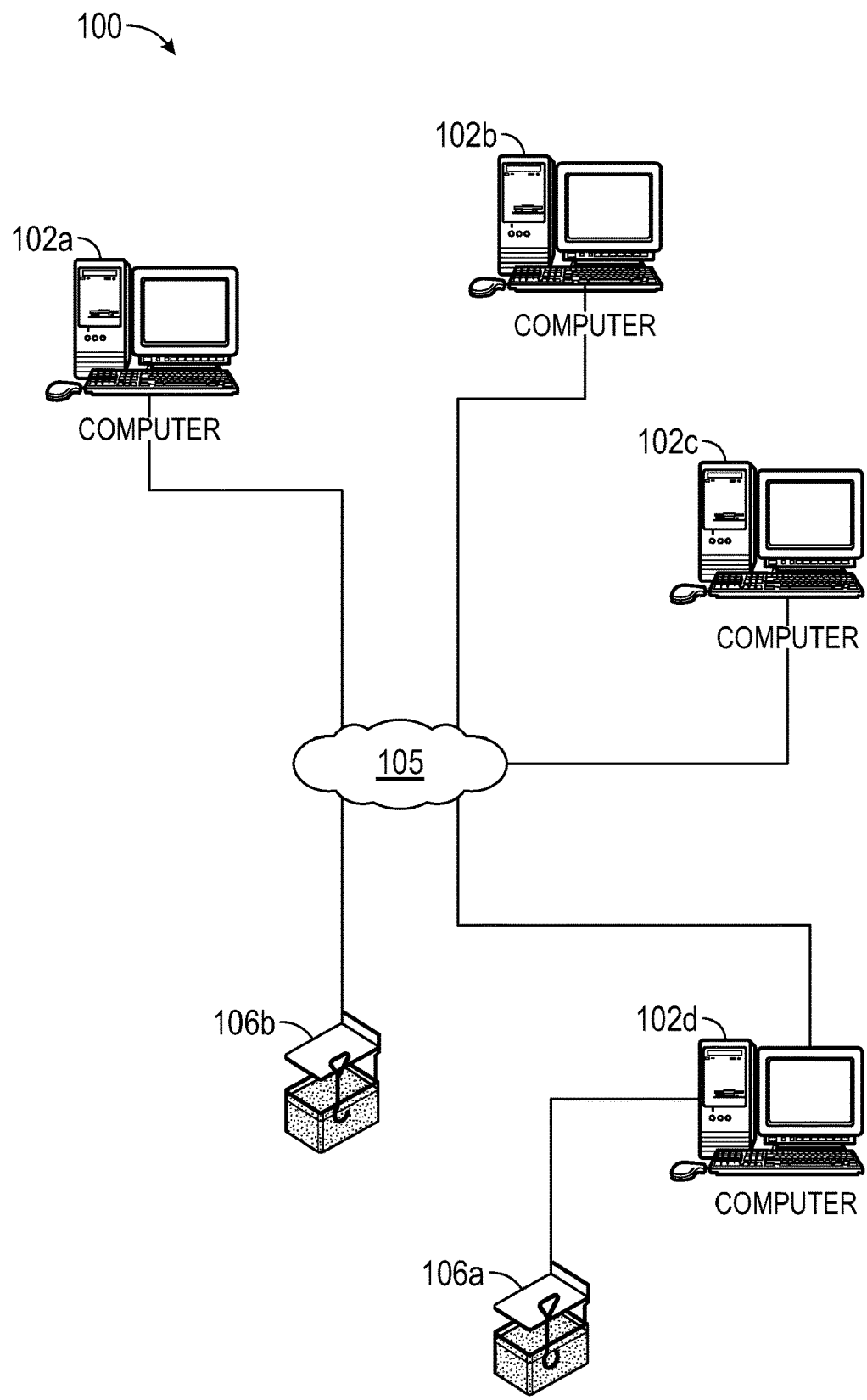
FIG. 1 is an example of a system for designing and manufacturing 3D objects.

Systems and methods disclosed herein include techniques for automatically reducing rigid body motion in a digital simulated model of an object, where the simulated model represents a simulated build of the object using additive manufacturing.

Though some embodiments described herein are described with respect to certain additive manufacturing techniques using certain building materials (e.g., metals), the described system and methods may also be used with certain other additive manufacturing techniques and/or certain other building materials as would be understood by one of skill in the art.

As discussed, computing devices can be used to simulate the build of an object using additive manufacturing. Such simulated builds of an object result in a simulated model of the object. Information contained in the simulated model of the object can be used to help better design the object for additive manufacturing. For example, the simulated model may indicate certain deformities in the object and/or stresses, strains, etc. on the object during the build process, or other information that can be used to modify the design of the object to improve the design of the object so it can successfully be built using additive manufacturing.

However, as discussed, the simulated build of an object may fail and abort in certain cases, resulting in an incomplete simulated model of the object. For example, numerical instability in the simulation (also referred to as rigid body motion) may cause the simulation to abort due to the numerical instability making further simulation impossible.

Accordingly, systems and methods disclosed herein include techniques for automatically reducing rigid body motion in a digital simulated model of an object, thereby allowing a complete simulated model of the object to be generated. Further, systems and methods are also disclosed herein that include techniques for utilizing elements (e.g., voxels or cubes) that are not perpendicular to a build area and/or are not all at the same angle with respect to one another (e.g., tilted elements, tilted voxels, tilted hex elements, pyramidal elements etc.) in a model (e.g., finite element model (FEM)) of an object, and using such a model to generate a digital simulated model of the object (e.g., with reduced rigid body motion), thereby allowing a complete simulated model of the object to be generated. Such embodiments beneficially provide a technical solution to the technical problem in additive manufacturing of how to generate simulated models for objects to be built using additive manufacturing when there is numerical instability in the simulation. Such embodiments further improve the field of additive manufacturing by providing more robust simulated models that can be used to enhance the object design and build process and reduce the likelihood of failed builds of objects. Further, such techniques may improve the functioning of computing devices used for generating the simulated models by allowing simulated models to be generated that previous computing devices were unable to generate due to numerical instability in the simulation. Further, such techniques may have low computational complexity, and therefore may reduce the number of computing cycles (e.g., equilibrium iterations) needed to be performed by a computing device to determine successfully reduce numerical instability and generate a simulated model of an object, thereby improving efficiency and functionality of the computing device itself.

Embodiments of the invention may be practiced within a system for designing, simulating, and manufacturing 3D objects. Turning to FIG. 1, an example of a computer environment suitable for the implementation of 3D object design, build simulation, and manufacturing is shown. The environment includes a system 100. The system 100 includes one or more computers 102a-102d, which can be, for example, any workstation, server, or other computing device capable of processing information. In some embodiments, each of the computers 102a-102d can be connected, by any suitable communications technology (e.g., an internet protocol), to a network 105 (e.g., the Internet). Accordingly, the computers 102a-102d may transmit and receive information (e.g., software, digital representations of 3-D objects, commands or instructions to operate an additive manufacturing device, etc.) between each other via the network 105.

The system 100 further includes one or more additive manufacturing devices (e.g., 3-D printers) 106a-106b. As shown the additive manufacturing device 106a is directly connected to a computer 102d (and through computer 102d connected to computers 102a-102c via the network 105) and additive manufacturing device 106b is connected to the computers 102a-102d via the network 105. Accordingly, one of skill in the art will understand that an additive manufacturing device 106 may be directly connected to a computer 102, connected to a computer 102 via a network 105, and/or connected to a computer 102 via another computer 102 and the network 105.

It should be noted that though the system 100 is described with respect to a network and one or more computers, the techniques described herein also apply to a single computer 102, which may be directly connected to an additive manufacturing device 106.

Figure 2:
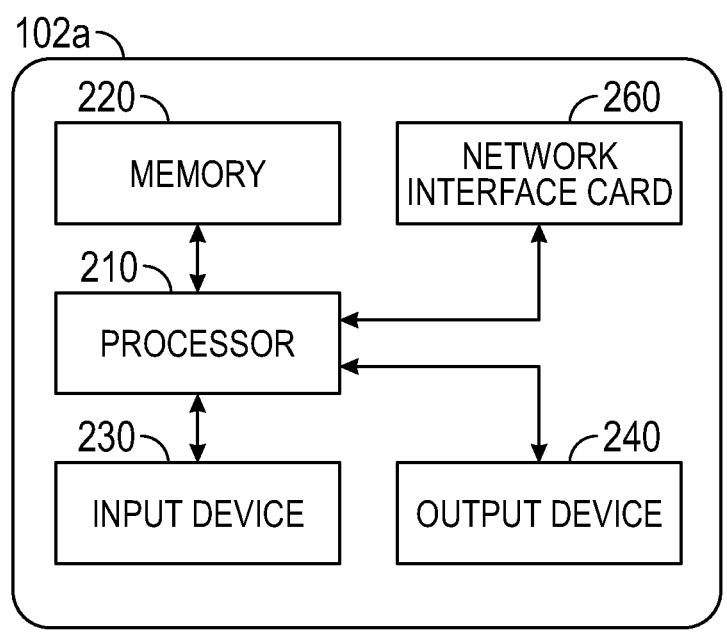
FIG. 2 illustrates a functional block diagram of one example of a computer shown in FIG. 1.

FIG. 2 illustrates a functional block diagram of one example of a computer of FIG. 1. The computer 102a includes a processor 210 in data communication with a memory 220, an input device 230, and an output device 240. In some embodiments, the processor is further in data communication with an optional network interface card 260. Although described separately, it is to be appreciated that functional blocks described with respect to the computer 102a need not be separate structural elements. For example, the processor 210 and memory 220 may be embodied in a single chip.

The processor 210 can be a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 210 can be coupled, via one or more buses, to read information from or write information to memory 220. The processor may additionally, or in the alternative, contain memory, such as processor registers. The memory 220 can include processor cache, including a multi-level hierarchical cache in which different levels have different capacities and access speeds. The memory 220 can also include random access memory (RAM), other volatile storage devices, or non-volatile storage devices. The storage can include hard drives, flash memory, etc. The memory 220 may store instructions that when executed by processor 210, cause processor 210 to perform one or more of the methods and/or techniques discussed herein.

The processor 210 also may be coupled to an input device 230 and an output device 240 for, respectively, receiving input from and providing output to a user of the computer 102a. Suitable input devices include, but are not limited to, a keyboard, buttons, keys, switches, a pointing device, a mouse, a joystick, a remote control, an infrared detector, a bar code reader, a scanner, a video camera (possibly coupled with video processing software to, e.g., detect hand gestures or facial gestures), a motion detector, or a microphone (possibly coupled to audio processing software to, e.g., detect voice commands). Suitable output devices include, but are not limited to, visual output devices, including displays and printers, audio output devices, including speakers, headphones, earphones, and alarms, additive manufacturing devices, and haptic output devices.

The processor 210 further may be coupled to a network interface card 260. The network interface card 260 prepares data generated by the processor 210 for transmission via a network according to one or more data transmission protocols. The network interface card 260 also decodes data received via a network according to one or more data transmission protocols. The network interface card 260 can include a transmitter, receiver, or both. In other embodiments, the transmitter and receiver can be two separate components. The network interface card 260, can be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein.

Figure 3:
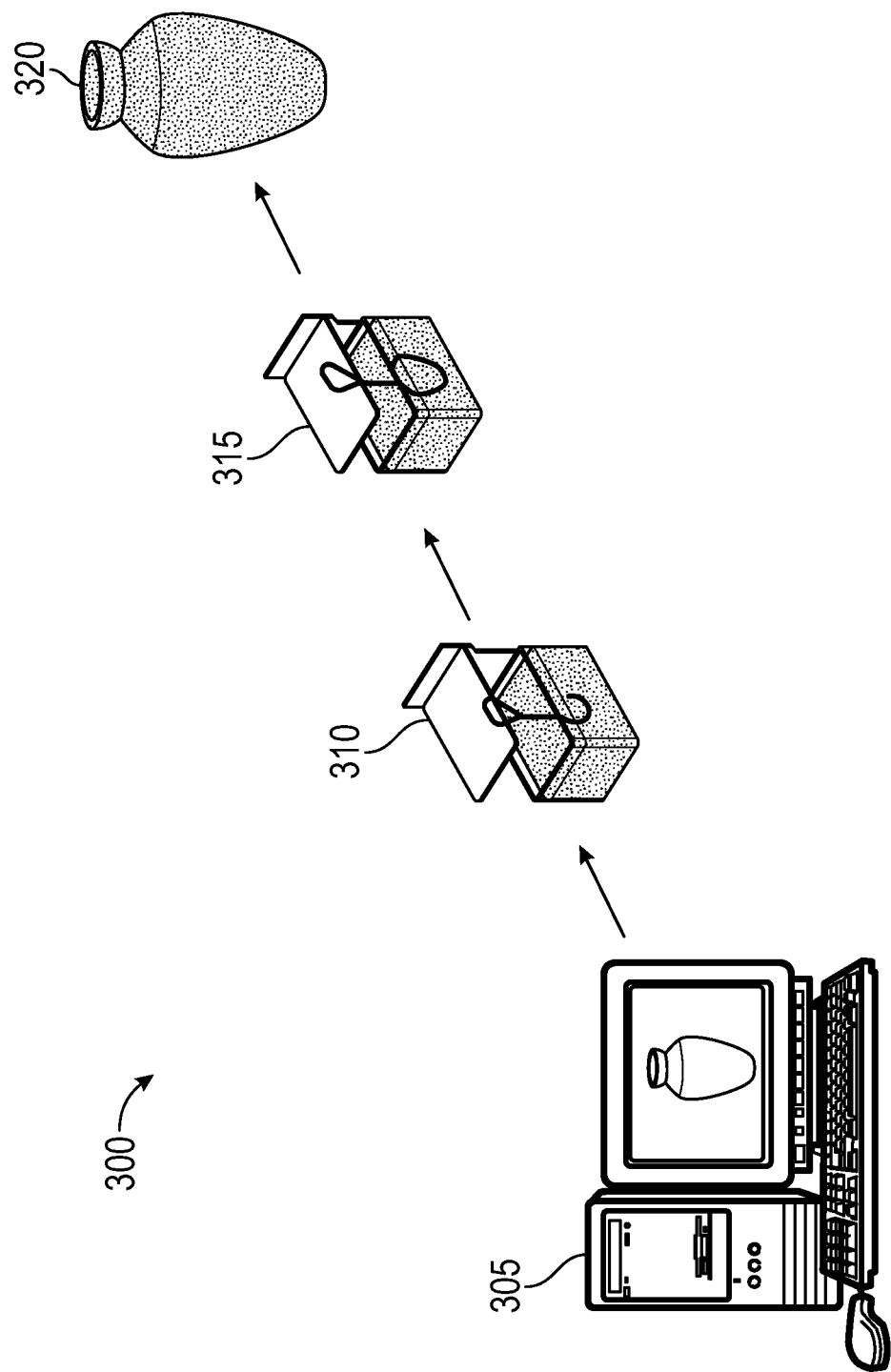
FIG. 3 shows a high level process for manufacturing a 3D object using.

FIG. 3 illustrates a process 300 for manufacturing a 3-D object or device. As shown, at a step 305, a digital representation of the object is designed using a computer, such as the computer 102a. For example, 2-D or 3-D data may be input to the computer 102a for aiding in designing the digital representation of the 3-D object. Continuing at a step 310, information is sent from the computer 102a to an additive manufacturing device, such as additive manufacturing device 106, and the device 106 commences the manufacturing process in accordance with the received information. At a step 315, the additive manufacturing device 106 continues manufacturing the 3-D object using suitable materials, such as a polymer or metal powder. Further, at a step 320, the 3-D object is generated.

Figure 4A:
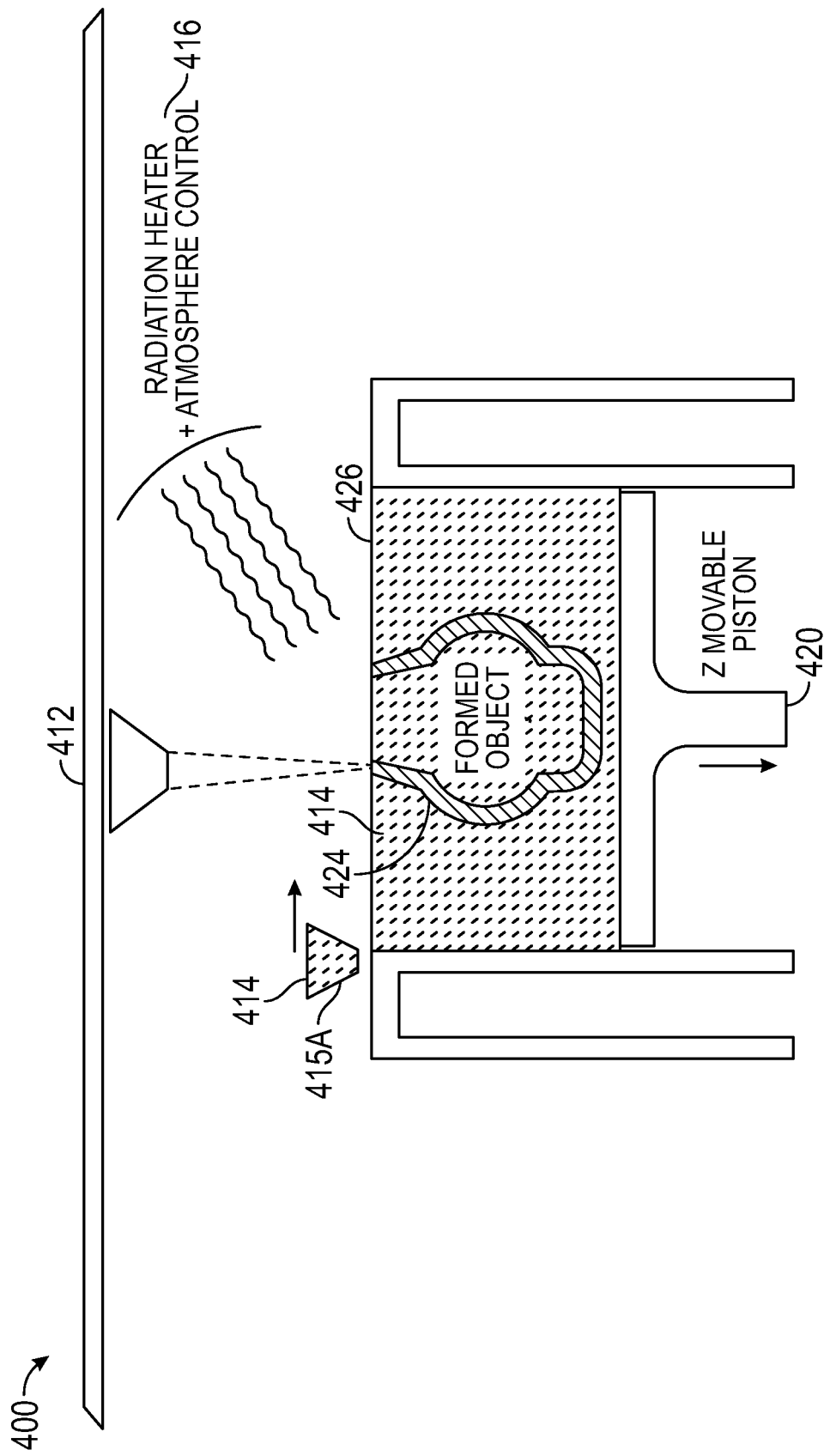
FIG. 4A is an example of an additive manufacturing apparatus with a recoating mechanism.

FIG. 4A illustrates an exemplary additive manufacturing apparatus 400 for generating a three-dimensional (3-D) object. In this example, the additive manufacturing apparatus 400 is a laser sintering device. The laser sintering device 400 may be used to generate one or more 3D objects layer by layer. The laser sintering device 400, for example, may utilize a powder (e.g., metal, polymer, etc.), such as the powder 414, to build an object a layer at a time as part of a build process.

Successive powder layers are spread on top of each other using, for example, a recoating mechanism 415A (e.g., a recoater blade). The recoating mechanism 415A deposits powder for a layer as it moves across the build area, for example in the direction shown, or in the opposite direction if the recoating mechanism 415A is starting from the other side of the build area, such as for another layer of the build. After deposition, a computer-controlled CO2 laser beam scans the surface and selectively binds together the powder particles of the corresponding cross section of the product. In some embodiments, the laser scanning device 412 is an X-Y moveable infrared laser source. As such, the laser source can be moved along an X axis and along a Y axis in order to direct its beam to a specific location of the top most layer of powder. Alternatively, in some embodiments, the laser scanning device 412 may comprise a laser scanner which receives a laser beam from a stationary laser source, and deflects it over moveable mirrors to direct the beam to a specified location in the working area of the device. During laser exposure, the powder temperature rises above the material (e.g., glass, polymer, metal) transition point after which adjacent particles flow together to create the 3D object. The device 400 may also optionally include a radiation heater (e.g., an infrared lamp) and/or atmosphere control device 416. The radiation heater may be used to preheat the powder between the recoating of a new powder layer and the scanning of that layer. In some embodiments, the radiation heater may be omitted. The atmosphere control device may be used throughout the process to avoid undesired scenarios such as, for example, powder oxidation.

Figure 4B:
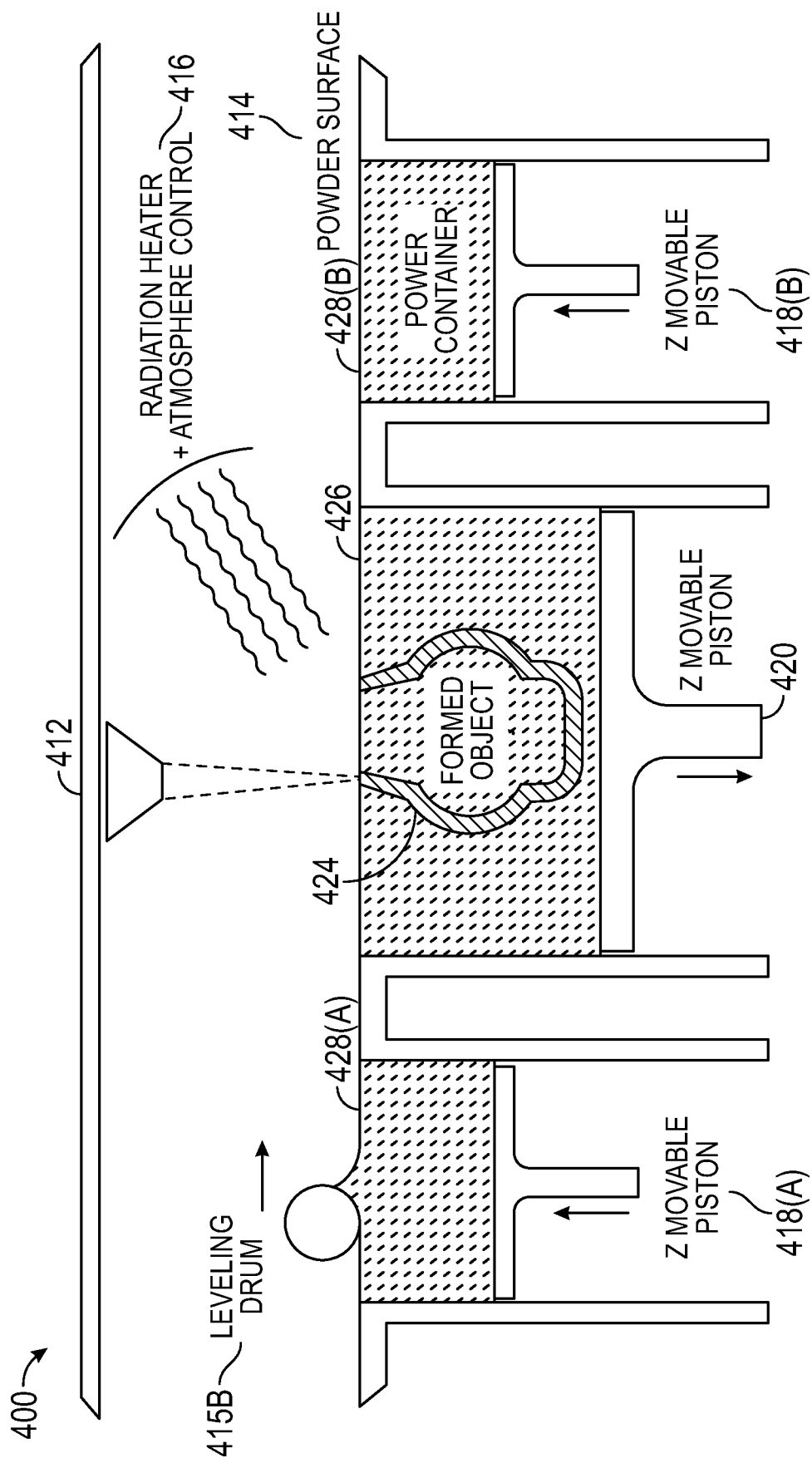
FIG. 4B is another example of an additive manufacturing apparatus with a recoating mechanism.

In some other embodiments, such as shown with respect to FIG. 4B, a recoating mechanism 415B (e.g., a leveling drum/roller) may be used instead of the recoating mechanism 415A. Accordingly, the powder may be distributed using one or more moveable pistons 418(a) and 418(b) which push powder from a powder container 428(a) and 428(b) into a reservoir 426 which holds the formed object 424. The depth of the reservoir, in turn, is also controlled by a moveable piston 420, which increases the depth of the reservoir 426 via downward movement as additional powder is moved from the powder containers 428(a) and 428(b) in to the reservoir 426. The recoating mechanism 415B, pushes or rolls the powder from the powder container 428(a) and 428(b) into the reservoir 426. Similar to the embodiment shown in FIG. 4A, the embodiment in FIG. 4B may use the radiation heater alone for preheating the powder between recoating and scanning of a layer.

In certain embodiments, a suitable computing device, such as computer 102, simulates a build of an object to be built using additive manufacturing. For example, in certain embodiments, the computing device uses numerical (e.g., finite element method (FEM) or finite element analysis (FEA)) simulation (e.g., macro layer based tetrahedral or voxel/hex mesh simulation) of building an object on a layer by layer basis, such as to determine potential layer-based deformations of the object that would occur when actually manufacturing the object using additive manufacturing techniques. For example, simulating a build of an object as discussed herein may be performed using such numerical simulation to generate a simulated model of the object.

For example, a digital finite element model (e.g., FEM model) of the object is input into a simulation program (e.g., a known simulation program that uses FEM, such as Simufact, Abaqus, Amphyon, etc.) running on the computing device. A digital finite element model may be obtained from a storage, generated by a user, or generated from a simulation program, such as by inputting a different digital model/ representation of the object (e.g., CAD file, STL file, etc.) into the simulation program, which then generates the finite element model. The simulation program uses the finite element model to perform FEM simulation of a build of the object. FIG. 5 illustrates an example of a finite element model 500 of an object.

As shown, finite element model 500 includes a plurality of elements 502 illustrated as cubes. The plurality of elements 502 represent the object. An element, as is known in the art, is the basic building block of a finite element model for performing FEM. Elements 502 divide the domain of the finite element model 500 into smaller subdomains to calculate the desired field/parameter (e.g., amount of shrinkage, displacement, reaction force, stresses, strains, etc.). In certain embodiments, an element comprises a cube with nodes at corners of the cube. It should be noted that though certain aspects are described herein with respect to using a cube as an element, other appropriate elements may similarly be used according to the embodiments described herein. In certain embodiments, each element 502 corresponds to a voxel.

FIG. 5A illustrates two example elements 502a and 502b for a finite element model. As shown, each of elements 502a and 502b includes a plurality of nodes connected by edges that form the element 502. In particular, element 502a includes 8 nodes numbered 1-8 (corresponding to node IDs 1-8), and element 502b includes 8 nodes numbered 5-12 (corresponding to node IDs 5-12). As shown, different elements may share nodes (e.g., nodes 5-8 are shown as shared between elements 502a and 502b). A node corresponds to a coordinate location in space. Accordingly, a node in a finite element model corresponds to a coordinate location in space corresponding to the object.

Each element and each node may be associated with an identifier, including an element identifier (ID) and node identifier (ID), respectively. For example, element 502a is shown as associated with element ID 1, and element 502b is shown as associated with element ID 2. Further, each element may be defined by its element ID and the node IDs of its nodes. For example, element 502a is defined as element ID 1 connected to node IDs 1-8, and element 502b is defined as element ID 2 connected to node IDs 5-12.

A node to element map may further be defined for nodes in a finite element model. For example, the node to element map may associate each node ID with the element IDs of elements that include the node. With respect to elements 502a and 502b of FIG. 5A, a node to element map 504 may be defined as shown in FIG. 5B, where node IDs 1-4 are associated with element ID 1, node IDs 5-8 are associated with element IDs 1-2, and node IDs 9-12 are associated with element ID 2.

The simulation program, based on the finite element model of the object discussed, performs FEM simulation of a build of the object and outputs a simulated model of the object comprising simulation of the layers including parameters (e.g., amount of shrinkage, displacement, reaction force, stresses, strains, etc.) for different nodes or regions (e.g., at different X-Y coordinates of an X-Y plane corresponding to a layer) of each layer of the object. As discussed, however, the simulation program may abort at one of the layers during the simulated build. For example, numerical instability in the simulation, known as rigid body motion, may cause the simulation program to fail and abort. For example, the simulation program may perform voxel approximation of the geometry of the object as part of simulating the build of the object. The voxel approximation may generate overhanging elements in the finite element model that cannot be supported by a previous layer in the build and lead to numerical instability causing the simulation program to abort. In particular, the deformation between points between the layers may be too great and beyond the parameters of a rigid body where it is assumed the two points are stable with respect to one another.

Figure 6A:
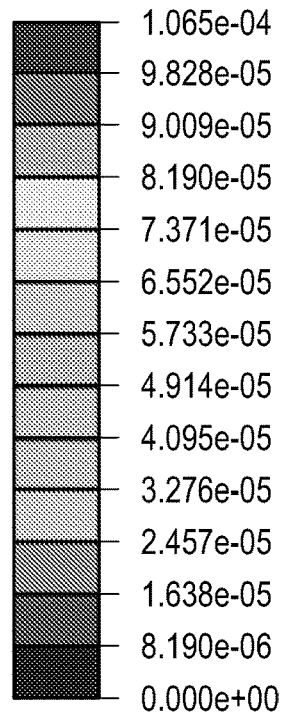
FIGS. 6A and 6B illustrate an example resulting simulated model of an example simulation of the build of the object represented by finite element model of FIG. 5.
Figure 6A:
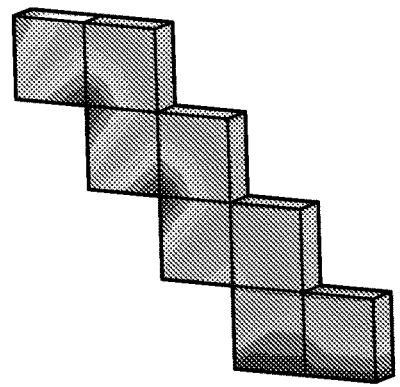
Figure 6B:
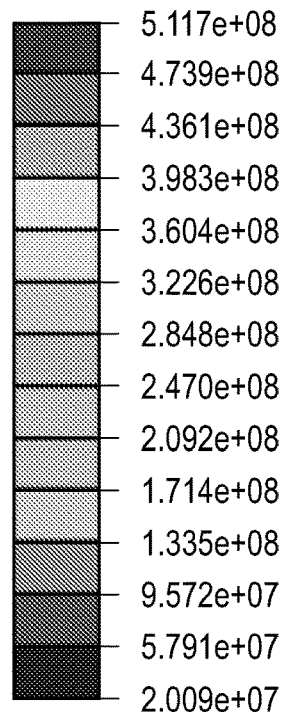
Figure 6B:
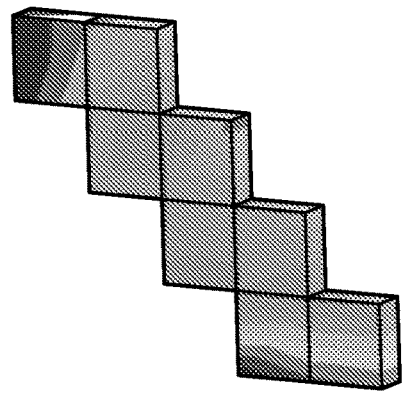

Accordingly, when the simulation program aborts, any layers after the layer where the simulation program aborts may not be included in a simulated model of the object generated by the simulation program. Therefore, only a portion of the object may be represented by the simulated model. FIGS. 6A and 6B illustrate the resulting simulated model of an example simulation of the build of the object represented by finite element model 500. As shown, the simulated model shown in FIGS. 6A and 6B does not include a representation of the entire object represented by finite element model 500, but only a portion of the object due to the simulation program aborting due to numerical instability in the simulation.

The simulated model in FIG. 6A represents simulated displacement that occurs at different positions (e.g., nodes) of the object during the simulated build. For example, the simulation program may indicate a displacement vector $U_{xyz}$ for each node indicating the displacement of that node in space between where the node is supposed to be in the object (e.g., relative to a build platform of the additive manufacturing device) when manufactured (e.g., the design location) and where the node is simulated to be when manufactured (e.g., the simulation location). The displacement vector $U_{xyz}$ may include a z component (e.g., a component perpendicular to a build platform and parallel with the direction of subsequent layers) and x and y components (e.g., components in a plane parallel to a build platform, in particular the plane of the layer itself). The displacement may mean that portions of the object may not be located in the correct location on the object, leading to deformations. The displacement vector for each node may be represented by a different color, shade, or number.

Similarly, simulated model in FIG. 6B represents simulated stress that occurs at different positions (e.g., nodes) of the object during the simulated build. For example, the simulation program may indicate a stress or force at each node indicating the stress on that node. If the stress is too high (e.g., higher than a stress tolerance of a build material), the object may deform, break, etc. The stress for each node may be represented by a different color, shade, or number.

As can be seen in FIGS. 6A and 6B, due to the simulation program aborting, information (e.g., displacement, stress, etc.) in the simulated model is limited to those nodes or portions of the object simulated prior to the abortion, and the simulated model does not include information about other portions of the object. Without such other information, it may be difficult to determine how to adjust the design of the object (e.g., in a digital model of the object) to have a successful simulated build of the object and eventually successful actual build of the object.

Accordingly, certain aspects herein provide systems and methods to modify a finite element model of the object prior to performing simulation of build of the object by a simulation program using the finite element model in order to reduce numerical instability in the simulation. Thus, when the modified finite element model is input into the simulation program, a simulated model is generated including the entire object.

Figure 7:
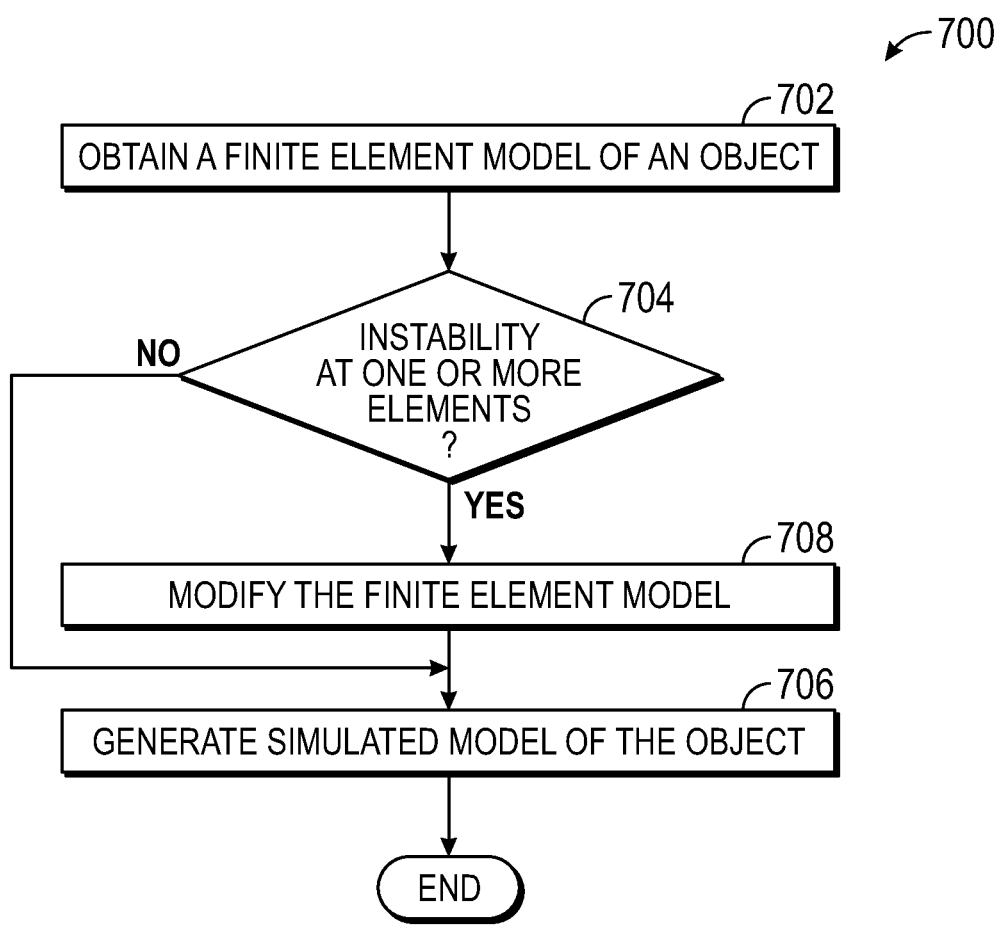
FIG. 7 is a flowchart of an example process for automatically reducing rigid body motion in a digital simulated model of an object to be built using additive manufacturing.

FIG. 7 is a flowchart of an example process 700 for automatically reducing rigid body motion in a digital simulated model of an object to be built using additive manufacturing. The process 700 may be performed by a suitable computing device, such as a computer 102.

At block 702, the computing device obtains a finite element model of an object. The finite element model may be one including elements that all have bottom surfaces parallel to a plane of a simulated build platform. Alternatively, the finite element model may be one including elements at different angles to one another and/or that are not parallel to a simulated build platform in a digital simulated model of an object to be built using additive manufacturing. At block 704, the computing device determines if there is any instability at one or more elements of the finite element model.

If no elements with instability are detected in the finite element model of the object, the computing device determines that simulated build of the entire finite element model of the object can be performed, and the computing device performs the simulation and generates a simulated model of the object at block 706.

If one or more elements with instability are detected, the computing device determines that simulated build of the entire finite element model of the object cannot be performed and continues to block 708.

At block 708, the computing device modifies the finite element model. In certain embodiments, the computing device adds one or more stability elements (e.g., one or more springs, additional elements, one dimensional elements, constraints, etc.) to support the one or more elements with instability. For example, in certain embodiments, the computing device adds information indicative of one or more springs to support the one or more elements with instability. The information may include simulating in the finite element model of the object, one or more springs as positioned with respect to the one or more elements with instability. For example, one end of such a spring may be positioned on a node (e.g., floating node as further discussed herein) corresponding to the one or more elements with instability, and the other end of the spring at a point on the area/plane corresponding to the build platform of the additive manufacturing device in the finite element model or another point on the object. In particular, the point on the area corresponding to the build platform may correspond to the intersection point between the area corresponding to the build platform and a line through the node that is perpendicular to the build platform (e.g., parallel to the z-axis). Alternatively, the point on the object may correspond to the intersection point between another surface of the object below the node along the z-axis and a line through the node that is perpendicular to the build platform (e.g., parallel to the z-axis). The spring may have a spring constant representative of powder to be present in the build platform during actual build of the object. For example, during actual build of the object, areas of the object being built may be supported by portions of previous layers of build material still present in the build area that are not part of the object built as discussed. Such portions of powder can provide a force that can be represented by a spring, and therefore such a spring force may be added to the finite element model to simulate such support.

The one or more springs may provide force in the Z-direction that reduces numerical instability during simulating build of the finite element model of the object by counteracting deformation forces by the spring force. Further, such springs may simulate actual real life scenarios encountered when building the object, so may still provide an accurate simulated model of the object. Accordingly, with the springs, the simulation program may no longer abort when simulating the build of the object and a complete simulated model can be generated. FIG. 8 illustrates springs 800 placed at nodes of finite element model 500, as discussed. Other springs may additionally be placed, though not shown. Further details on the modification of a finite element model to include springs are discussed with respect to FIG. 13.

Alternatively or additionally, in certain embodiments, one or more extra/additional elements are placed in the finite element model to support the one or more elements with instability. For example, one or more elements are added that couple to the one or more elements with instability and to other elements that do not have instability to provide support for the one or more elements with instability. Accordingly, the one or more additional elements may provide support in one or more spatial directions that reduces numerical instability during simulating build of the finite element model of the object by counteracting deformation forces, such as from an unsupported overhang. Thus, with the additional elements, the simulation program may no longer abort when simulating the build of the object and a complete simulated model can be generated. FIG. 9 illustrates additional elements 900 placed in finite element model 500, as discussed. Further details on the modification of a finite element model to include one or more additional elements are discussed with respect to FIG. 14.

Alternatively or additionally, in certain embodiments, one or more one dimensional elements may be included in the finite element model to support the one or more elements with instability. For example, each one dimensional element couples at one end to a node (e.g., a floating node) corresponding to an element with instability and at another end to another node in the finite element model to provide support to stabilize the element with instability. Accordingly, the one dimensional element may provide support in one or more spatial directions that reduces numerical instability during simulating build of the digital model of the object by counteracting deformation forces, such as from an unsupported overhang. Accordingly, with the one or more one dimensional elements, the simulation program may no longer abort when simulating the build of the object and a complete simulated model can be generated. FIG. 10 illustrates one dimensional element 1000 placed in finite element model 500, as discussed. Other one dimensional elements may additionally be placed, though not shown. Further details on the modification of a finite element model to include one or more one dimensional elements are discussed with respect to FIG. 15.

Alternatively or additionally, in certain embodiments, the finite element model may be constrained from moving at one or more nodes (e.g., one or more floating nodes as further discussed herein) associated with one or more elements with instability. For example, the displacement (e.g., displacements to be assigned) at the one or more nodes may be set to be zero, regardless of any other calculations in the simulation program. Accordingly, numerical instability during simulating build of the finite element model of the object may be eliminated by removing the errant displacement from the simulated model that caused the instability. Accordingly, with the constraint(s), the simulation program may no longer abort when simulating the build of the object and a complete simulated model can be generated. Other constraints may additionally be placed, though not shown. FIG. 11 illustrates constraint 1100 placed at a node of finite element model 500, as discussed. In certain embodiments, adding constraints may influence the outcome of the simulation by brute force assignment of the displacement at floating nodes. Accordingly, in certain embodiments, addition of such constraints at floating nodes is avoided.

The process 700 then continues to 706 where the computing device performs the simulation and generates a simulated model of the object. FIGS. 12A (simulated displacement) and 12B (simulated stress) illustrate the resulting simulated model of an example simulation of the build of an object of finite element model 500 after modification. As shown, the simulated model shown in FIGS. 12A and 12B, unlike FIGS. 6A and 6B, does include a representation of the entire object, due to the reduced numerical instability in the simulation.

Figure 13:
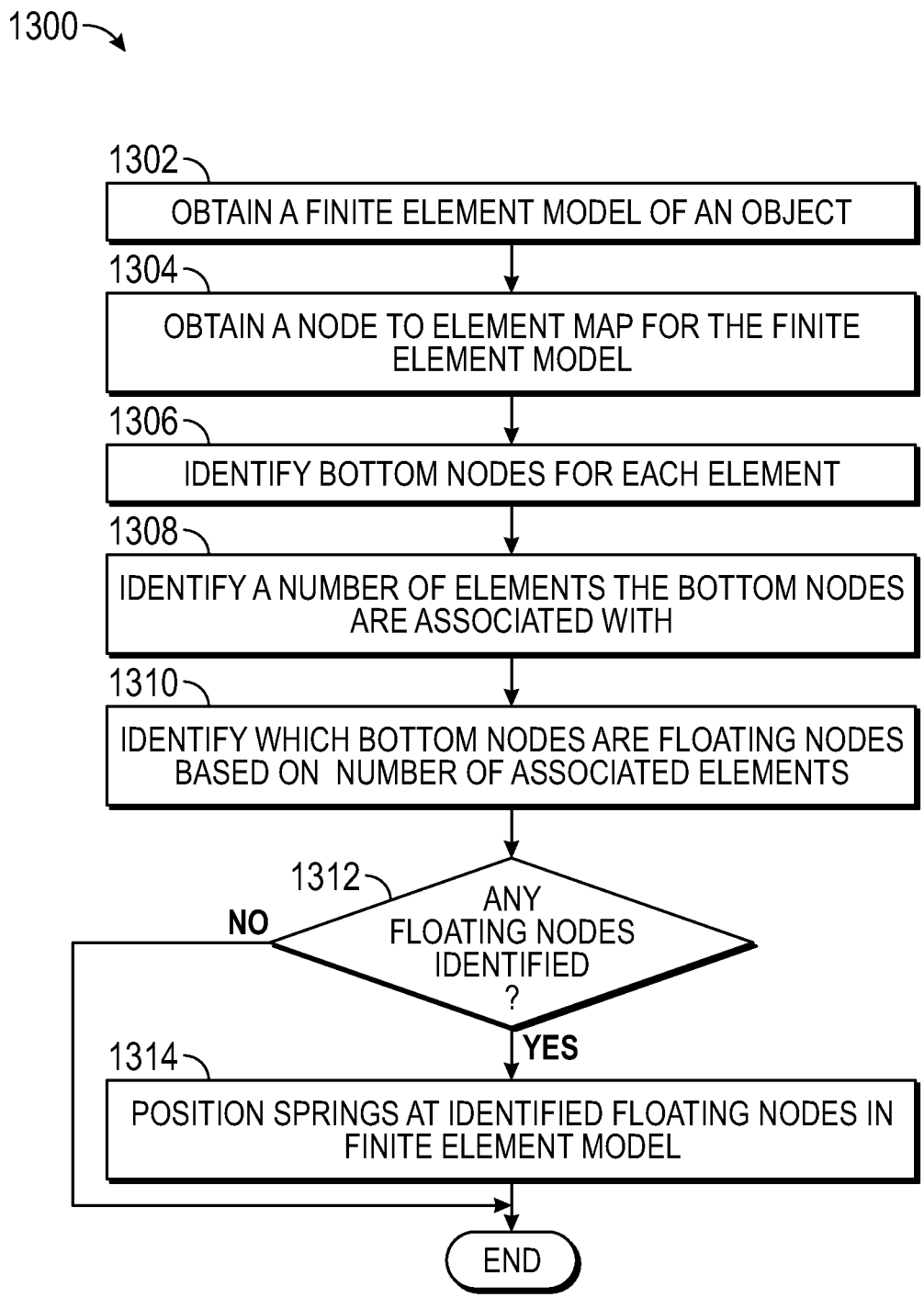
FIG. 13 is a flowchart of an example process for automatically reducing rigid body motion in a digital simulated model of an object to be built using additive manufacturing by including springs in a finite element model of the object.

FIG. 13 is a flowchart of an example process 1300 for automatically reducing rigid body motion in a digital simulated model of an object to be built using additive manufacturing by including springs in a finite element model of the object. The process 1300 may be performed by a suitable computing device, such as a computer 102. The process 1300 may be performed as part of process 700 as will be discussed.

Figures 13A, 13B, 13C:
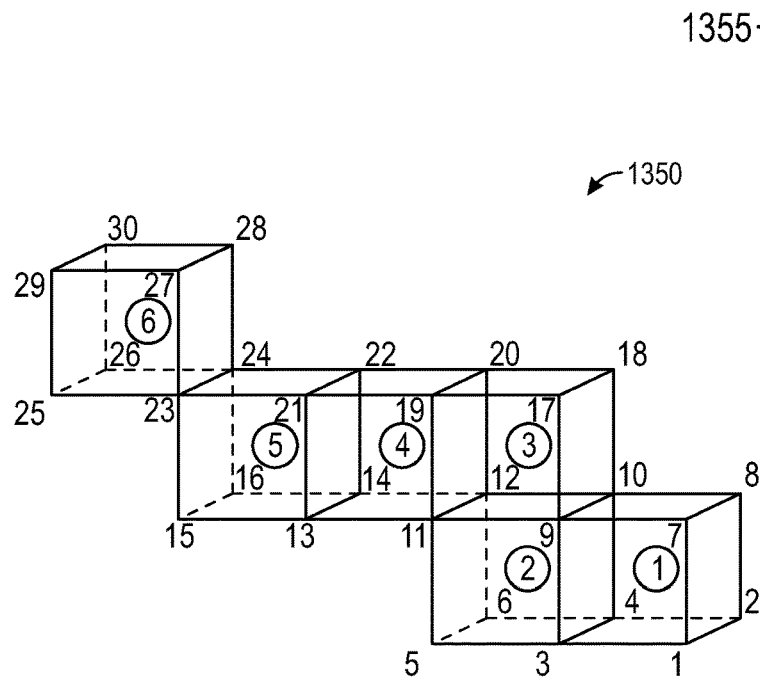
FIG. 13A illustrates an example of a finite element model of an object.
FIG. 13B illustrates an example node to element map of the finite element model of FIG. 13A.
FIG. 13C illustrates a table identifying floating nodes of the finite element model of FIG. 13A.

For illustrative purposes, certain aspects of process 1300 are described with respect to a finite element model 1350 of an object as shown in FIG. 13A. As shown, the finite element model 1350 includes elements 1-6, having corresponding nodes 1-30 as illustrated. FIG. 13B illustrates a node to element map 1355, as discussed, for finite element model 1350.

At block 1302, the computing device obtains a finite element model (e.g., finite element model 1350) of the object, including information about the elements and nodes of the object. For example, the computing device obtains a definition of elements of the object including an element ID for each element associated with the node IDs of the nodes of the element. Block 1302 may correspond to block 702. At block 1304, the computing device obtains a node to element map (e.g., node to element map 1355) for the finite element model (e.g., generates a node to element map based on the information about the elements and nodes of the object).

At block 1306, the computing device identifies bottom nodes for each element of the finite element model (e.g., other than elements in contact with the build platform). For example, nodes that contact the build platform may already be constrained in the finite element model and thus not need to be evaluated. Bottom nodes correspond to nodes of an element that are closest to the build platform (i.e., lowest nodes along a z-axis from the build platform) in the finite element model. Accordingly, a bottom node of an element comprises a node of the element in a plane of the element that is a closest parallel plane to a build platform intersecting the element. For example, where the elements are cubes, the elements may be oriented so that a bottom surface of each element is parallel to a plane of the build platform. For example, in FIG. 5A, the build platform may be in a plane corresponding to nodes 1-4. Accordingly, the bottom nodes of element 502a correspond to nodes 1-4 as those are the nodes of the bottom surface of the cube of element 502a with respect to the plane of the build platform. Similarly, the bottom nodes of element 502b correspond to nodes 6-8. In the example of finite element model 1350, the bottom nodes of each element are identified in a table 1360 shown in FIG. 13C.

At block 1308, the computing device identifies a number of elements the bottom nodes (e.g., for all elements other than elements in contact with the build platform) are associated with, such as by using the node to element map obtained at block 1304. For example, for each bottom node, the computing device determines the number of element IDs that are associated with the node ID corresponding to the bottom node. The number of element IDs associated with the node ID indicates the number of elements the bottom node is associated with. For example, table 1360 indicates the elements that each bottom node of finite element model 1350 is associated with.

At block 1310, the computing device identifies any element (e.g., other than elements in contact with the build platform) with two or more bottom nodes associated with only a single element as an instable element and identifies such bottom nodes associated with only a single element as floating nodes. For example, blocks 1304-1310 may be performed for determining instability of one or more elements and correspond to block 704.

Table 1360 indicates the number of bottom nodes of finite element model 1350 for each element shared by only a single element. As shown, elements 1, 2, 5, and 6 of finite element model 1350 include 2 bottom nodes shared by a single element, and therefore are potentially instable elements. However, as discussed, elements 1 and 2 contact the build platform and therefore may not be considered instable elements, and further corresponding potential floating nodes 1, 2, 5, and 6 may not be considered floating nodes. Accordingly, elements 5 and 6 may be considered instable elements. Further, bottom nodes 15, 16, 25, and 26 are considered floating nodes as corresponding to the bottom nodes associated with only a single element.

At block 1312, the computing device determines if any floating nodes have been identified. If no floating nodes have been identified, the finite element model includes no instable elements and the finite element model may be used to generate a simulated model of the object, such as discussed with respect to block 706. Accordingly, the process 1300 ends.

If floating nodes have been identified, process 1300 proceeds to block 1314. At block 1314 an end of a spring is positioned at each of one or more of the floating nodes to modify the finite element model, such as discussed with respect to block 708. The modified finite element model may be used to generate a simulated model of the object, such as discussed with respect to block 706. Accordingly, the process 1300 ends.

Figure 14:
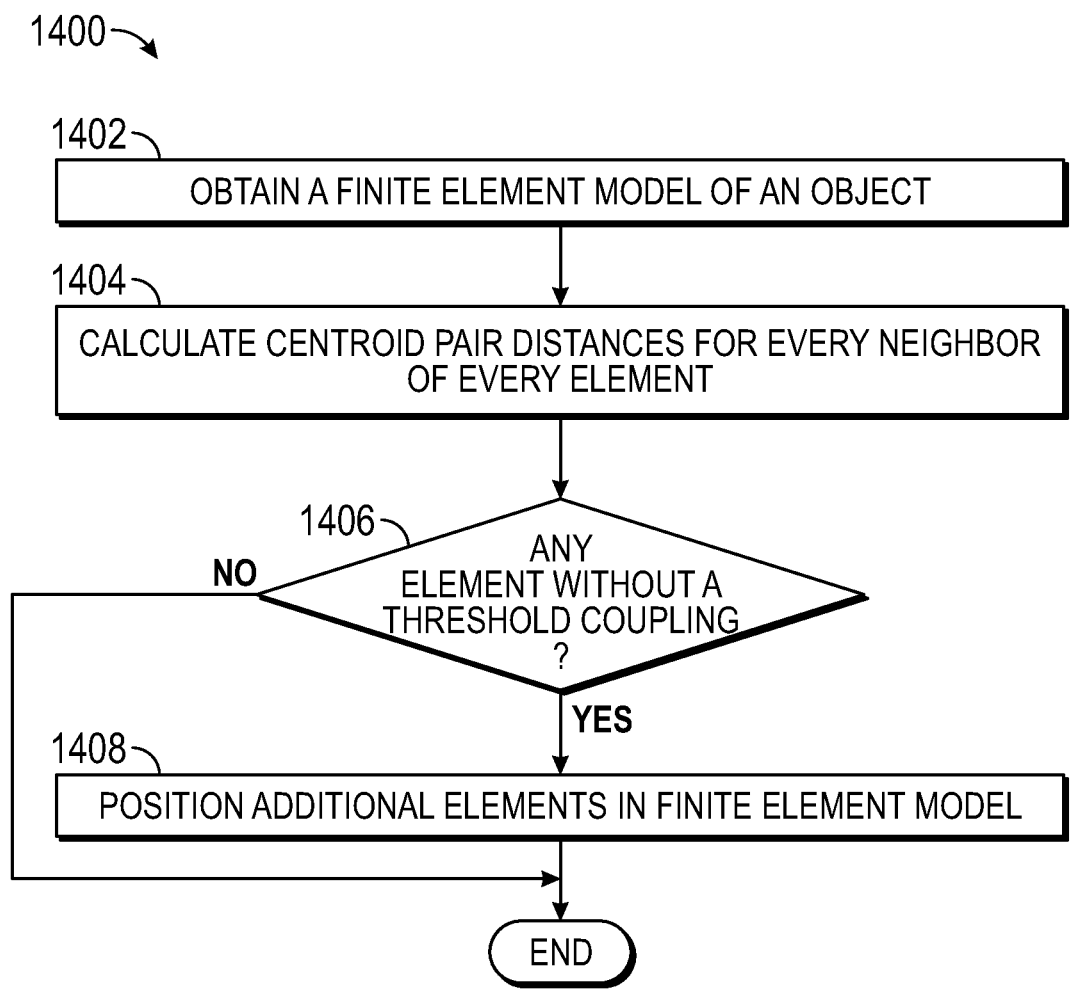
FIG. 14 is a flowchart of an example process for automatically reducing rigid body motion in a digital simulated model of an object to be built using additive manufacturing by including one or more additional elements in a finite element model of the object.

FIG. 14 is a flowchart of an example process 1400 for automatically reducing rigid body motion in a digital simulated model of an object to be built using additive manufacturing by including one or more additional elements in a finite element model of the object. The process 1400 may be performed by a suitable computing device, such as a computer 102. The process 1400 may be performed as part of process 700 as will be discussed.

At block 1402, the computing device obtains a finite element model of the object, including information about the elements and nodes of the object. Block 1402 may correspond to block 702. At block 1404, the computing device calculates centroid pair distances for every neighbor of every element (e.g., other than elements in contact with the build platform) of the finite element model.

Figure 14A:
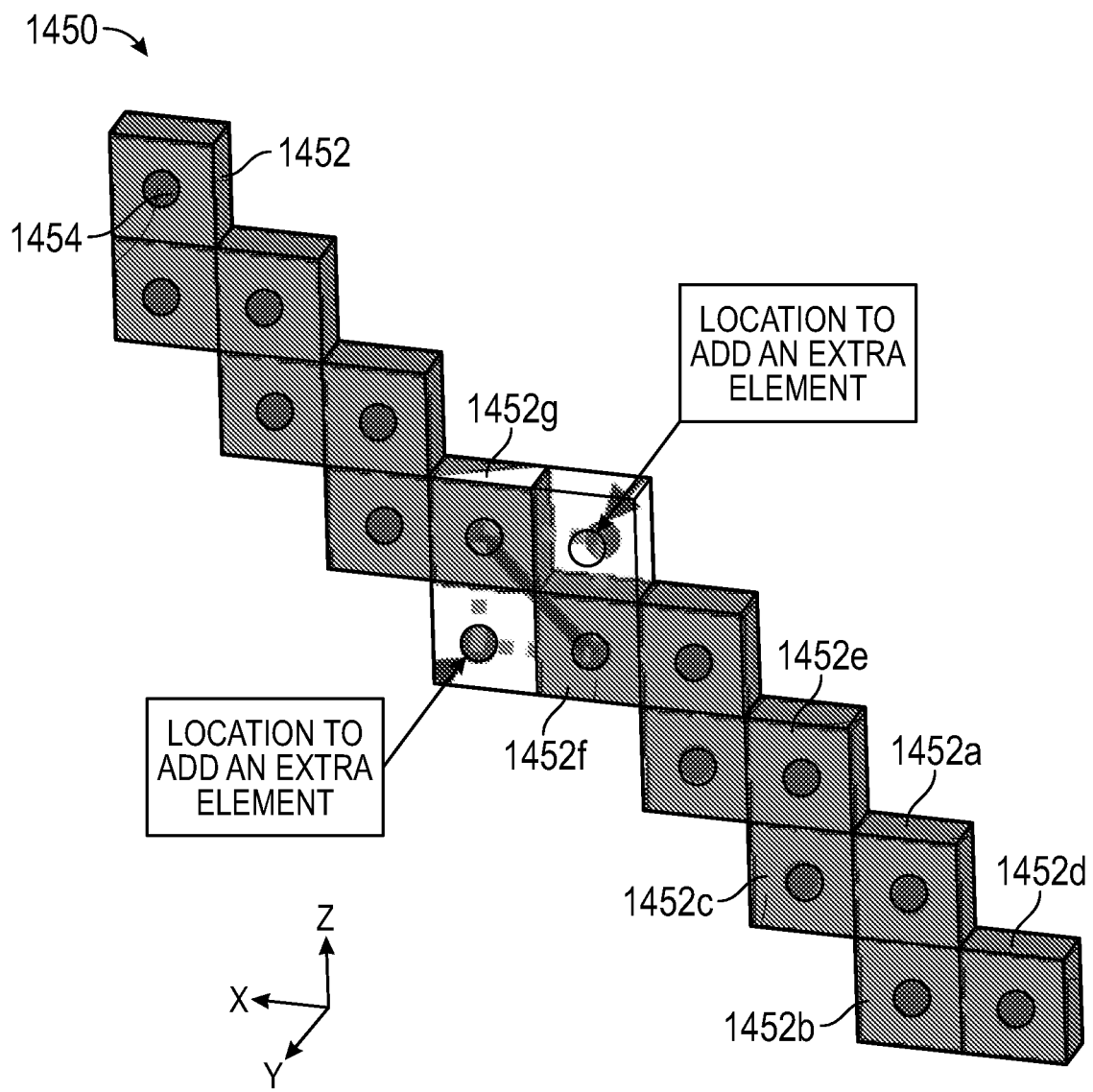
FIG. 14A illustrates an example of a finite element model of an object.

For example, FIG. 14A illustrates a finite element model 1450 of an object, including elements 1452. As shown, a centroid 1454 of each element 1452 is defined. The centroid 1454 of an element 1452 corresponds to the center (e.g., in x, y, z coordinates) of the element 1452. A centroid pair distance for an element corresponds to the distance between the centroid of the element and the centroid of a neighboring element. A neighboring element for a given element, is defined as any element that shares at least one node with the given element.

At block 1406, the computing device determines if any element does not have a coupling to a neighboring element via a path of one or more centroid pair distances that are less than or equal to a threshold length. The threshold length may be an element edge length. For example, as discussed, each element in the finite element model is a cube with equal length edges between nodes of the cube as discussed. The element edge length is the length of the edge of the cube that defines the element. Elements may be "coupled" if they share one or more nodes. Further, elements may be coupled via a path of elements, where each element along the path shares at least one node with a previous element along the path.

For example, in FIG. 14A, element 1452a has neighboring elements 1452b-1452e. As shown, element 1452a has a centroid pair distance equal to the element edge length with each of neighboring elements 1452b and 1452c. Further, though the centroid pair distance between element 1452a and each of neighboring elements 1452d and 1452e is greater than the element edge length, neighboring elements 1452d and 1452e are coupled to elements 1452b and 1452c, respectively. The centroid pair distance between element 1452d and 1452b and the centroid pair distance between element 1452e and 1452c both equal the element edge length. Accordingly, there is a path between element 1452a and 1452e via element 1452c with centroid pair distances between the elements along the path being less than or equal to the element edge length. Further, there is a path between element 1452a and 1452d via element 1452b with centroid pair distances between the elements along the path being less than or equal to the element edge length. Therefore, element 1452a has a coupling to each of its neighboring elements via a path of one or more centroid pair distances that are less than or equal to a threshold length.

In contrast, element 1452f has neighboring element 1452g. The centroid pair distance between elements 1452f and 1452g is greater than the element edge length, and further there is no path of one or more centroid pair distances that are less than or equal to a threshold length between elements 1452f and 1452g.

In certain embodiments, any element that does not have a coupling to a neighboring element via a path of one or more centroid pair distances that are less than or equal to a threshold length is determined to be an instable element. For example, elements 1452f and 1452g may be considered instable elements. For example, blocks 1404-1406 may be performed for determining instability of one or more elements and correspond to block 704.

If no element does not have a coupling to a neighboring element via a path of one or more centroid pair distances that are less than or equal to a threshold length (also referred to as a path that meets a centroid pair distance requirement), the finite element model includes no instable elements and the finite element model may be used to generate a simulated model of the object, such as discussed with respect to block 706. Accordingly, the process 1400 ends.

If at least one element does not have a coupling to a neighboring element via a path of one or more centroid pair distances that are less than or equal to a threshold length, the process 1400 proceeds to 1408.

At block 1408 one or more additional elements are positioned as coupled to the at least one element to modify the finite element model, such as discussed with respect to block 708. For example, one or more additional elements are added as coupled to each of the at least one element and the neighboring element(s) that it does not have a path with that meets the centroid pair distance requirement, such that with the one or more additional elements, the at least one element and the neighboring element(s) do have a path that meets the centroid pair distance requirement. FIG. 14A illustrates locations where such elements may be added to support instable elements 1452f and 1452g. The modified finite element model may be used to generate a simulated model of the object, such as discussed with respect to block 706. Accordingly, the process 1400 ends.

Figure 15:
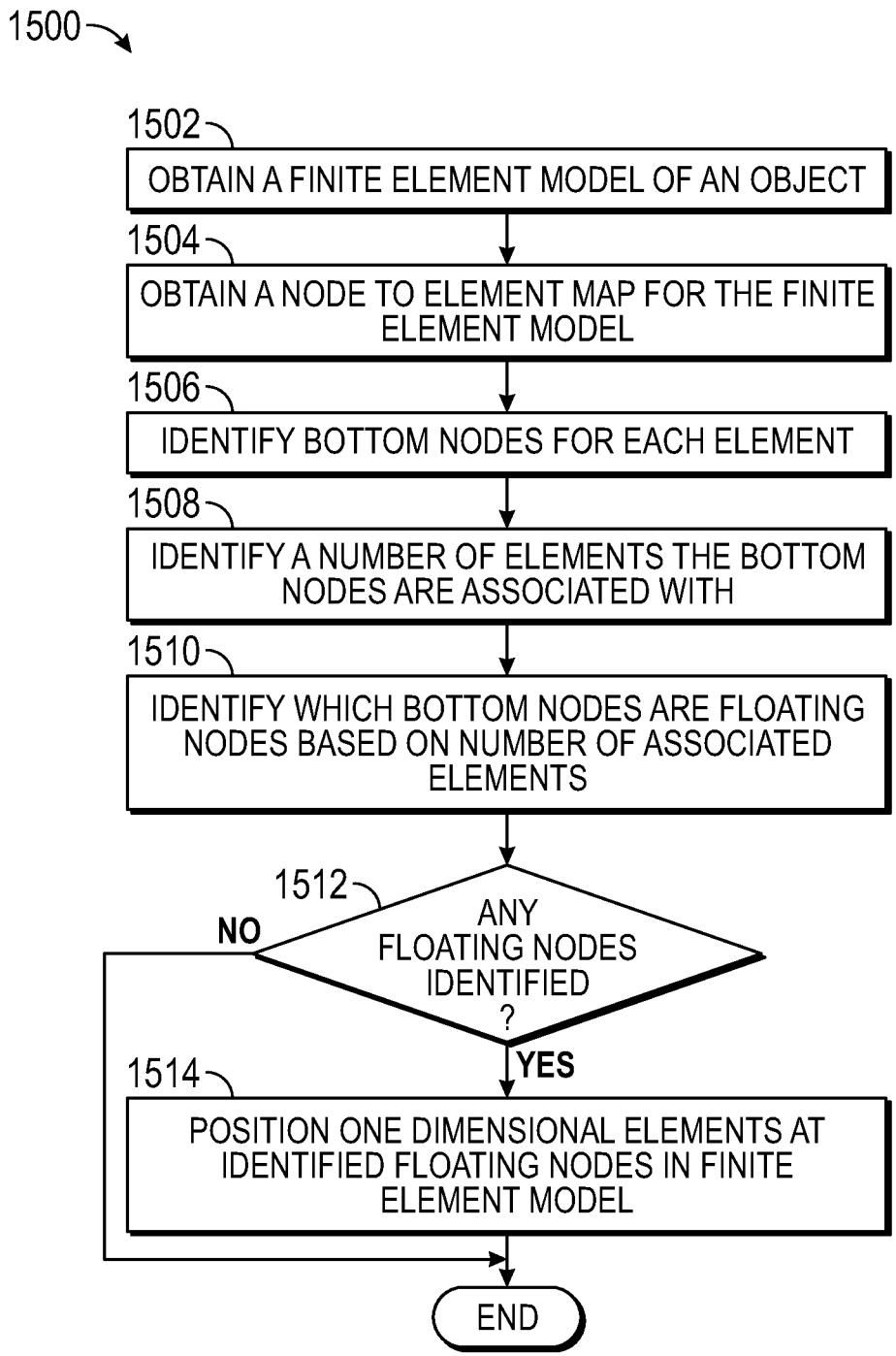
FIG. 15 is a flowchart of an example process for automatically reducing rigid body motion in a digital simulated model of an object to be built using additive manufacturing by including one dimensional elements in a finite element model of the object.

FIG. 15 is a flowchart of an example process 1500 for automatically reducing rigid body motion in a digital simulated model of an object to be built using additive manufacturing by including one dimensional elements in a finite element model of the object. The process 1500 may be performed by a suitable computing device, such as a computer 102. The process 1500 may be performed as part of process 700 as will be discussed.

At block 1502, the computing device obtains a finite element model of the object, including information about the elements and nodes of the object. For example, the computing device obtains a definition of elements of the object including an element ID for each element associated with the node IDs of the nodes of the element. Block 1502 may correspond to block 702. At block 1504, the computing device obtains a node to element map for the finite element model (e.g., generates a node to element map based on the information about the elements and nodes of the object).

At block 1506, the computing device identifies bottom nodes for each element of the finite element model (e.g., other than elements in contact with the build platform).

At block 1508, the computing device identifies a number of elements the bottom nodes (e.g., for all elements other than elements in contact with the build platform) are associated with, such as by using the node to element map obtained at block 1504. For example, for each bottom node, the computing device determines the number of element IDs that are associated with the node ID corresponding to the bottom node. The number of element IDs associated with the node ID indicates the number of elements the bottom node is associated with.

At block 1510, the computing device identifies any element (e.g., other than elements in contact with the build platform) with two or more bottom nodes associated with only a single element as an instable element and identifies such bottom nodes associated with only a single element as floating nodes. For example, blocks 1504-1510 may be performed for determining instability of one or more elements and correspond to block 704.

At block 1512, the computing device determines if any floating nodes have been identified. If no floating nodes have been identified, the finite element model includes no instable elements and the finite element model may be used to generate a simulated model of the object, such as discussed with respect to block 706. Accordingly, the process 1500 ends.

Figure 15A:
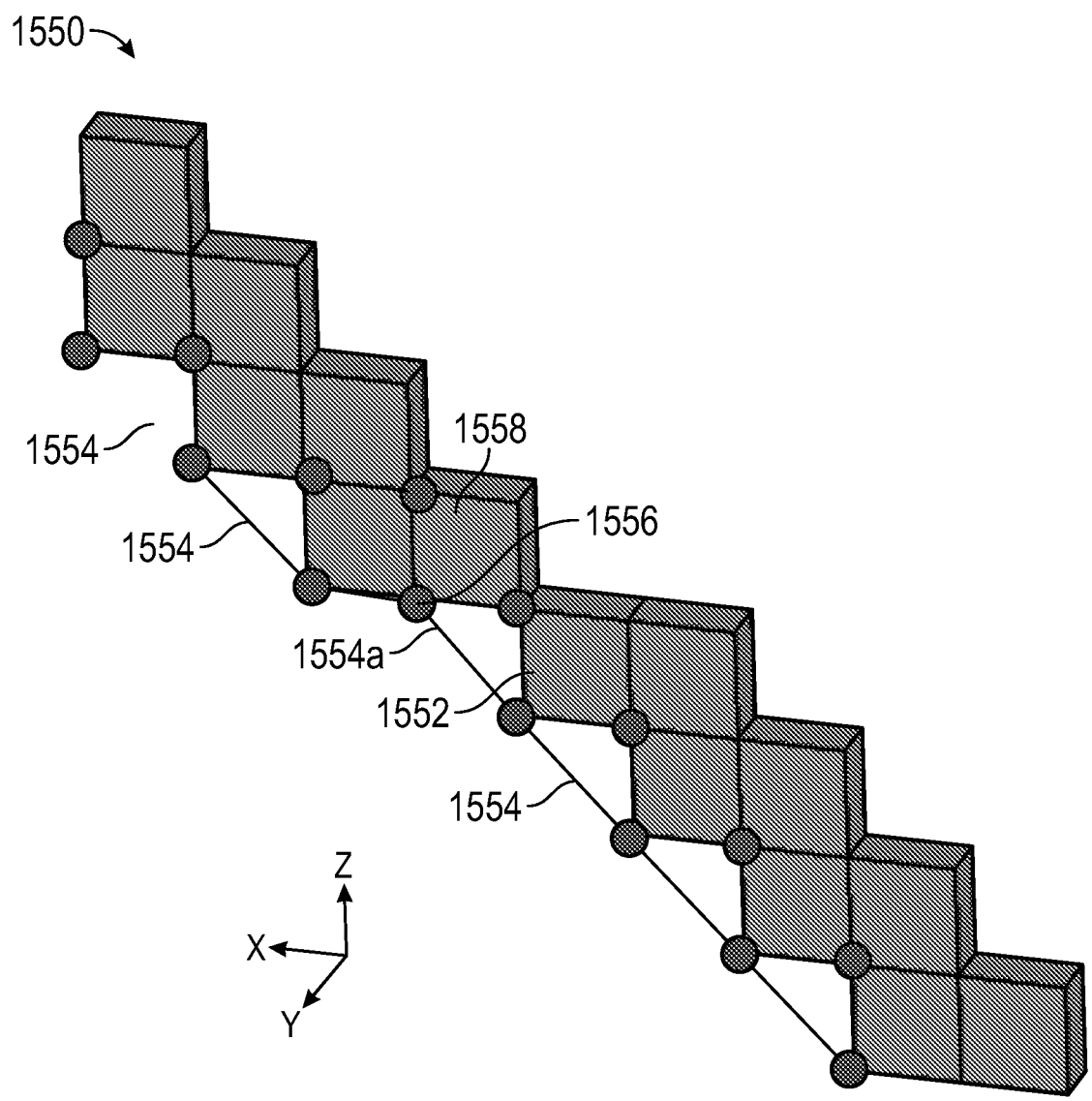
FIG. 15A illustrates an example of a finite element model of an object.

If floating nodes have been identified, process 1500 proceeds to block 1514. At block 1514, one or more diagonal nodal pairs are identified that couple to the floating nodes and included as one or more one-dimensional elements in the finite element model to modify the finite element model, such as discussed with respect to block 708. In particular each of the one or more diagonal nodal pairs may couple to a floating node, and a node of an element that is closer (e.g., in the Z direction) to the build platform than the element with the floating node. For example, a diagonal nodal pair is an in-plane (e.g., in the XZ plane) diagonal connection between two nodes that do not belong to the same element and have a characteristic length (e.g., element edge length*sqrt(2)). FIG. 15A illustrates a finite element model 1550 including several diagonal nodal pairs 1554. As shown diagonal nodal pair 1554a couples floating node 1556 to a node on element 1552 that is closer to the build platform than element 1558 that includes floating node 1556.

The modified finite element model may be used to generate a simulated model of the object, such as discussed with respect to block 706. Accordingly, the process 1500 ends.

Accordingly, certain embodiments herein provide automated processes for reducing rigid body motion in a digital simulated model of an object, where the simulated model represents a simulated build of the object using additive manufacturing.

In some cases, numerical instability in a simulated build of an object may arise due to the position and orientation of the elements in a finite element model. For example, as shown in the examples discussed with respect to 5-15A, all the elements in the finite element model have bottom surfaces that are parallel to a plane of a simulated build platform. Accordingly, elements in the finite element model, such as when represented by cubes or other particular shapes, may not have good contact between one another along angles that are not parallel or perpendicular to the simulated build platform. Therefore, numerical instability may arise due to the finite element model including elements that are all at the same angle (e.g., having bottom surfaces at the same angle such as parallel to a plane of a simulated build platform) and therefore not having sufficient contact between them.

Accordingly, certain embodiments herein provide for a finite element model (e.g., generating a finite element model) with elements at different angles to one another (e.g., having bottom surfaces at different angles to one another) and/or that are not parallel to a simulated build platform (e.g., having bottom surfaces that are not parallel to the simulated build platform). Such a finite element model may have increased contact between (e.g., adjacent) elements, thereby reducing numerical instability when used to perform a simulated build of an object.

Figure 16A:
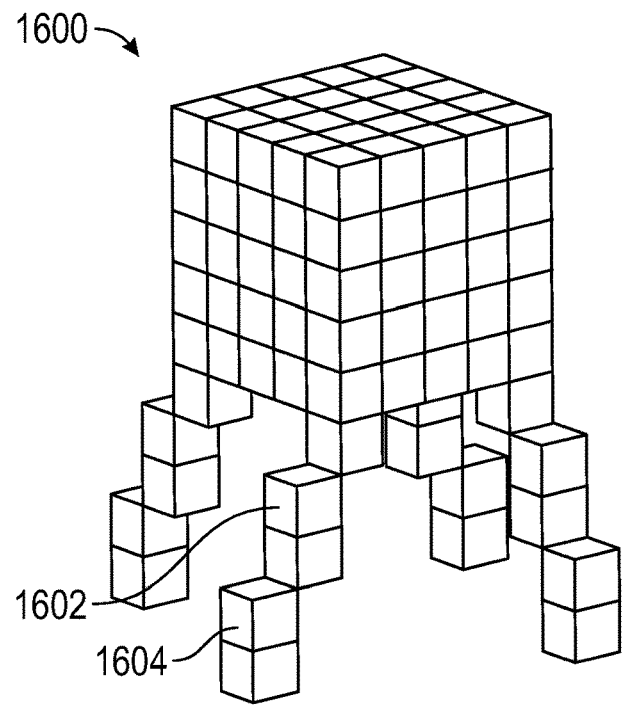
FIG. 16A illustrates a finite element model of an object including elements that all have bottom surfaces parallel to a plane of a simulated build platform.

For example, FIG. 16A illustrates a finite element model 1600 of an object including elements that all have bottom surfaces parallel to a plane of a simulated build platform. As shown, there is not good contact between elements 1602 and 1604, which can lead to numerical instability when finite element model 1600 is used to perform a simulated build of the object.

Figure 16B:
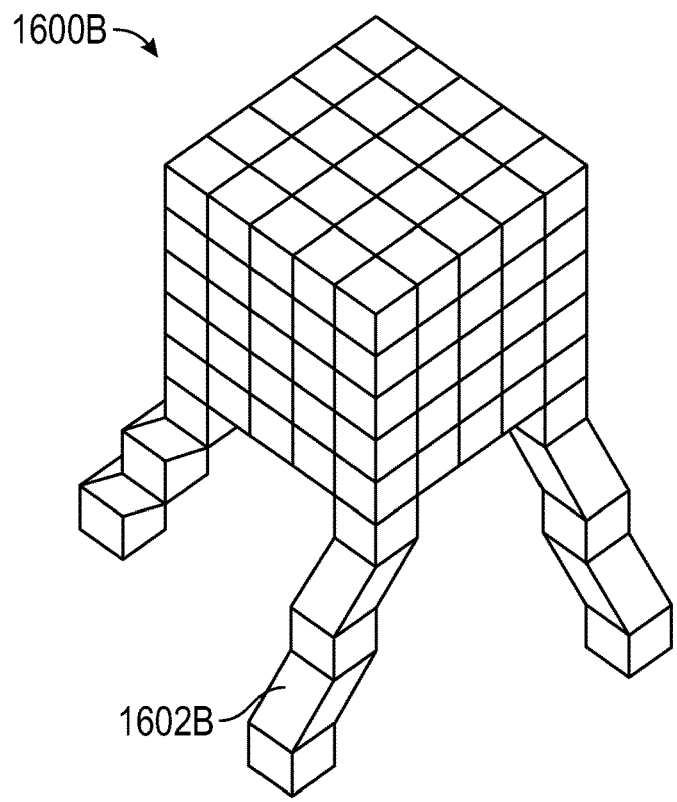
FIG. 16B illustrates a finite element model of the object including elements that have bottom surfaces not all parallel to the plane of the simulated build platform.

In contrast, FIG. 16B illustrates a finite element model 1600B of the object including elements that have bottom surfaces not all parallel to the plane of the simulated build platform. As shown, elements 1602 and 1604 are replaced by element 1602B, ensuring good contact between elements in the finite element model 1600B, which can reduce numerical instability when finite element model 1600B is used to perform a simulated build of the object as compared to finite element model 1600A.

Figure 16C:
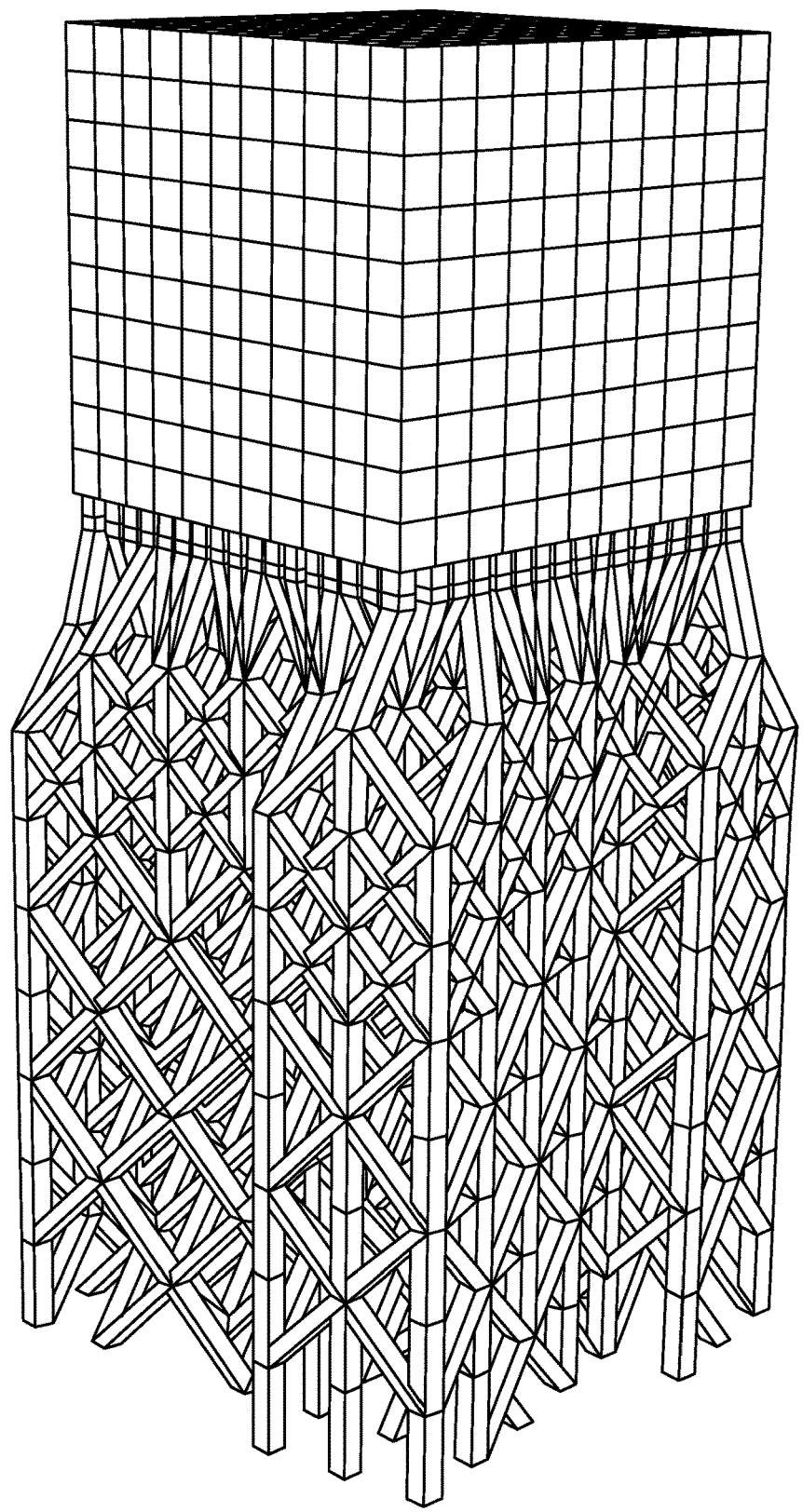
FIG. 16C illustrates a finite element model of an object including elements that have bottom surfaces not all parallel to the plane of the simulated build platform.

FIG. 16C illustrates another example of a finite element model 1600C of an object including elements that have bottom surfaces not all parallel to the plane of the simulated build platform.

Figure 17:
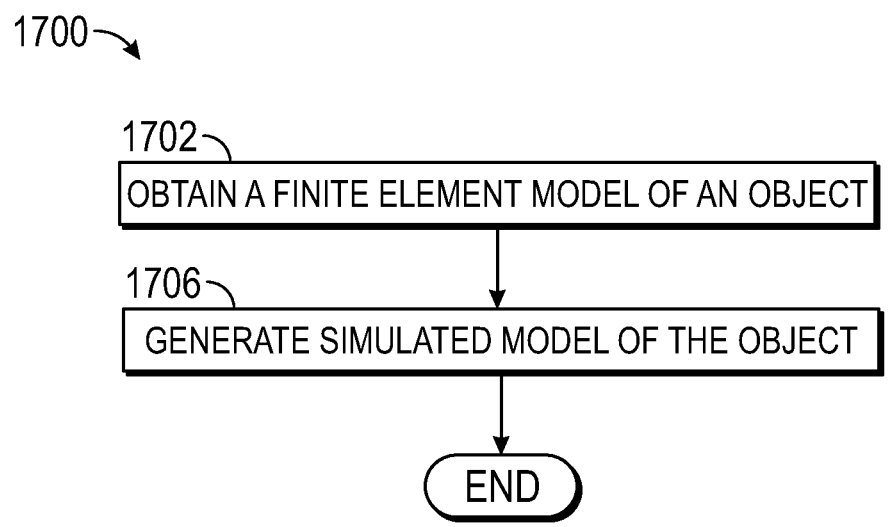
FIG. 17 is a flowchart of an example process for using a finite element model with elements at different angles to one another and/or that are not parallel to a simulated build platform in a digital simulated model of an object to be built using additive manufacturing.

FIG. 17 is a flowchart of an example process 1700 for using a finite element model with elements at different angles to one another and/or that are not parallel to a simulated build platform in a digital simulated model of an object to be built using additive manufacturing. The process 1700 may be performed by a suitable computing device, such as a computer 102.

At block 1702, the computing device obtains a finite element model of an object. The finite element model includes elements at different angles to one another and/or that are not parallel to a simulated build platform in a digital simulated model of an object to be built using additive manufacturing.

At block 1706, the computing device performs the simulation and generates a simulated model of the object using the finite element model.

In certain aspects, the finite element model comprising a plurality of elements including a first element having a bottom surface that is not parallel to a simulated build platform of a simulated additive manufacturing device. In certain aspects, the plurality of elements comprises another element having a bottom surface parallel to the simulated build platform. In certain aspects, the plurality of elements comprises another element having a bottom surface at a different angle to the simulated build platform than the bottom surface of the first element. In certain aspects, each of the plurality of elements comprises a cube with nodes at corners of the cube.

Various embodiments disclosed herein provide for the use of a computer control system. A skilled artisan will readily appreciate that these embodiments may be implemented using numerous different types of computing devices, including both general purpose and/or special purpose computing system environments or configurations. Examples of well-known computing systems, environments, and/or configurations that may be suitable for use in connection with the embodiments set forth above may include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like. These devices may include stored instructions, which, when executed by a microprocessor in the computing device, cause the computer device to perform specified actions to carry out the instructions. As used herein, instructions refer to computer-implemented steps for processing information in the system. Instructions can be implemented in software, firmware or hardware and include any type of programmed step undertaken by components of the system.

A microprocessor may be any conventional general purpose single- or multi-chip microprocessor such as a Pentium® processor, a Pentium® Pro processor, a 8051 processor, a MIPS® processor, a Power PC® processor, or an Alpha® processor. In addition, the microprocessor may be any conventional special purpose microprocessor such as a digital signal processor or a graphics processor. The microprocessor typically has conventional address lines, conventional data lines, and one or more conventional control lines.

Aspects and embodiments of the inventions disclosed herein may be implemented as a method, apparatus or article of manufacture using standard programming or engineering techniques to produce software, firmware, hardware, or any combination thereof. The term "article of manufacture" as used herein refers to code or logic implemented in hardware or non-transitory computer readable media such as optical storage devices, and volatile or non-volatile memory devices or transitory computer readable media such as signals, carrier waves, etc. Such hardware may include, but is not limited to, field programmable gate arrays (FPGAs), application-specific integrated circuits (ASICs), complex programmable logic devices (CPLDs), programmable logic arrays (PLAs), microprocessors, or other similar processing devices.

What is claimed is:

1. A computer-implemented method for modifying a finite element model of a 3D object to reduce rigid body motion experienced by the finite element model during build simulation for additive manufacturing, the method comprising:
   obtaining the finite element model, the finite element model comprising a plurality of nodes and a plurality of elements, wherein one or more nodes of the plurality of nodes are associated with more than one element of the plurality of elements;
   identifying a plurality of bottom nodes of the plurality of elements;
   determining a number of elements associated with each of the plurality of bottom nodes;
   identifying one or more bottom nodes of the plurality of bottom nodes that are associated with only one element as one or more floating nodes;
   modifying the finite element model to include one or more stability elements at the one or more floating nodes, the one or more stability elements configured to reduce numerical instability of the finite element model during simulating build of the object; and
   simulating build of the object using the modified finite element model to generate a simulated model of the object.

2. The method of claim 1, further comprising obtaining a node to element map for the finite model, the node to element map indicating associativity of each of the plurality of nodes with the plurality of elements, wherein determining the number of elements associated with each of the plurality of bottom nodes is based on the node to element map.

3. The method of claim 1, wherein each of the plurality of elements comprises a cube with nodes at corners of the cube.

4. The method of claim 1, wherein a bottom node of an element comprises a node of the element in a plane of the element that is a closest parallel plane to a build platform intersecting the element.

5. The method of claim 1, wherein identifying one or more bottom nodes of the plurality of bottom nodes that are associated with only one element as one or more floating nodes comprises:

identifying one or more elements of the plurality of elements having at least two bottom nodes that are associated with only one element; and identifying the at least two bottom nodes of each of the one or more elements as the one or more floating nodes.

6. The method of claim 1, wherein the one or more stability elements comprise one or more springs, and wherein modifying the finite element model to include one or more stability elements at the one or more floating nodes comprises modeling each of the one or more springs as coupled to a floating node at one end and to a build platform at another end.

7. The method of claim 6, wherein modeling each of the one or more springs as coupled to a floating node at one end and to a build platform at another end comprises modeling each of the one or more springs as coupled to the build platform at a point on the build platform that is perpendicular to the floating node.

8. The method of claim 1, wherein the one or more stability elements comprise one or more springs, and wherein modifying the finite element model to include one or more springs at the one or more floating nodes comprises modeling each of the one or more springs in the finite element model as having a spring constant based on a material used to build the object.

9. The method of claim 1, wherein the one or more stability elements comprise one or more one dimensional elements, and wherein modifying the finite element model to include one or more stability elements at the one or more floating nodes comprises:
identifying one or more diagonal nodal pairs that couple to the one or more floating nodes; and
including the one or more diagonal nodal pairs as the one or more one dimensional elements.

10. The method of claim 9, wherein each of the one or more diagonal nodal pairs couple to a given floating node of a given element and a given node of another given element that is closer to a build platform than the given element.

11. The method of claim 1, further comprising modifying the object based on the simulated model of the object; and building the modified object using additive manufacturing.

12. A non-transitory computer-readable medium having computer-executable instructions stored thereon, which, when executed by a processor of a computing device, cause the computing device to perform a method for modifying a finite element model of a 3D object to reduce rigid body motion experienced by the finite element model during build simulation for additive manufacturing, the method comprising:
obtaining the finite element model, the finite element model comprising a plurality of nodes and a plurality of elements, wherein one or more nodes of the plurality of nodes are associated with more than one element of the plurality of elements;
identifying a plurality of bottom nodes of the plurality of elements;
determining a number of elements associated with each of the plurality of bottom nodes;
identifying one or more bottom nodes of the plurality of bottom nodes that are associated with only one element as one or more floating nodes;
modifying the finite element model to include one or more stability elements at the one or more floating nodes, the one or more stability elements configured to reduce numerical instability of the finite element model during simulating build of the object; and
simulating build of the object using the modified finite element model to generate a simulated model of the object.

13. The non-transitory computer-readable medium of claim 12, the method further comprising: modifying the object based on the simulated model of the object; and building the modified object using additive manufacturing.

14. The non-transitory computer-readable medium of claim 12, wherein a bottom node of an element comprises a node of the element in a plane of the element that is a closest parallel plane to a build platform intersecting the element.

15. The non-transitory computer-readable medium of claim 12, wherein identifying one or more bottom nodes of the plurality of bottom nodes that are associated with only one element as one or more floating nodes comprises:
identifying one or more elements of the plurality of elements having at least two bottom nodes that are associated with only one element; and
identifying the at least two bottom nodes of each of the one or more elements as the one or more floating nodes.

16. The non-transitory computer-readable medium of claim 12, wherein the one or more stability elements comprise one or more springs, and wherein modifying the finite element model to include one or more stability elements at the one or more floating nodes comprises: modeling each of the one or more springs as coupled to a floating node at one end and to a build platform at another end.

17. A computing device comprising
a memory; and
a processor configured to perform a method for modifying a finite element model of a 3D object to reduce rigid body motion experienced by the finite element model during build simulation for additive manufacturing, the method comprising:
obtaining the finite element model, the finite element model comprising a plurality of nodes and a plurality of elements, wherein one or more nodes of the plurality of nodes are associated with more than one element of the plurality of elements;
identifying a plurality of bottom nodes of the plurality of elements; determining a number of elements associated with each of the plurality of bottom nodes;
identifying one or more bottom nodes of the plurality of bottom nodes that are associated with only one element as one or more floating nodes;
modifying the finite element model to include one or more stability elements at the one or more floating nodes, the one or more stability elements configured to reduce numerical instability of the finite element model during simulating build of the object; and
simulating build of the object using the modified finite element model to generate a simulated model of the object.

18. The computing device of claim 17, the method further comprising: modifying the object based on the simulated model of the object; and building the modified object using additive manufacturing.

19. The computing device of claim 17, wherein identifying one or more bottom nodes of the plurality of bottom nodes that are associated with only one element as one or more floating nodes comprises:
identifying one or more elements of the plurality of elements having at least two bottom nodes that are associated with only one element; and
identifying the at least two bottom nodes of each of the one or more elements as the one or more floating nodes.

20. The computing device of claim 17, wherein the one or more stability elements comprise one or more springs, and wherein modifying the finite element model to include one or more stability elements at the one or more floating nodes comprises: modeling each of the one or more springs as coupled to a floating node at one end and to a build platform at another end.

\* \* \* \* \*